United States Patent [19]

Ishihara et al.

[11] Patent Number: 4,717,585
[45] Date of Patent: Jan. 5, 1988

[54] PROCESS FOR FORMING DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Toyko, Japan

[21] Appl. No.: 826,898

[22] Filed: Feb. 6, 1986

[30] Foreign Application Priority Data

| | | | |
|---|---|---|---|
| Feb. 9, 1985 | [JP] | Japan | 60-023913 |
| Feb. 12, 1985 | [JP] | Japan | 60-025897 |
| Feb. 18, 1985 | [JP] | Japan | 60-029808 |
| Feb. 19, 1985 | [JP] | Japan | 60-031052 |
| Feb. 20, 1985 | [JP] | Japan | 60-031870 |
| Feb. 21, 1985 | [JP] | Japan | 60-031583 |

[51] Int. Cl.⁴ .............................................. B05D 3/06
[52] U.S. Cl. .................................. 427/39; 427/53.1; 437/233
[58] Field of Search .............. 427/87, 50, 95, 53.1, 427/93, 12, 55, 126.1–126.6, 109, 255.2, 255.6, 86, 38, 45.1, 39; 204/157.15, 157.3, 157.4

[56] References Cited

U.S. PATENT DOCUMENTS

| | | | |
|---|---|---|---|
| 3,825,439 | 7/1974 | Tick | 427/87 |
| 3,916,034 | 10/1975 | Tsuchimoto | 427/85 |
| 4,220,488 | 9/1980 | Duchemin et al. | 118/719 |
| 4,434,188 | 2/1984 | Kamo et al. | 427/113 |
| 4,461,783 | 7/1984 | Yamazaki | 427/86 |
| 4,521,447 | 6/1985 | Ovshinsky et al. | 427/38 |
| 4,522,663 | 6/1985 | Ovshinsky et al. | 427/86 |
| 4,569,697 | 2/1986 | Tsu et al. | 427/86 |
| 4,582,560 | 4/1986 | Sanjurjo | 427/86 |

FOREIGN PATENT DOCUMENTS

| | | | |
|---|---|---|---|
| 0090586 | 10/1983 | European Pat. Off. | 427/39 |
| 59-199035 | 11/1984 | Japan | 427/39 |

Primary Examiner—John H. Newsome
Attorney, Agent, or Firm—Fitzpatrick, Cella, Harper & Scinto

[57] ABSTRACT

A process for forming a deposited film comprises introducing into a film forming space housing a substrate therein an active species (A) formed by decomposition of a compound containing carbon and a halogen and an active species (B) formed from a chemical substance for film formation which is reactive with said active species (A) separately from each other, and then allowing both the species to react with each other thereby to form a deposited film on the substrate.

21 Claims, 4 Drawing Figures

PROCESS FOR FORMING DEPOSITED FILM

BACKGROUND OF THE INVENTION

1. Field of the Invention

This invention relates to a process suitable for forming a deposited film, above all a functional film, particularly an amorphous or crystalline deposited film to be used for semiconductor devices, photosensitive devices for electrophotography, line sensors for image input, image pick-up devices, photovoltaic devices etc.

2. Description of the Prior Art

For example, for formation of an amorphous silicon film, an amorphous germanium film, etc. the vacuum deposition method, the plasma CVD method, the CVD method, the reactive sputtering method, the ion plating method, the optical CVD method or the like have been attempted to be practiced, and, in general, the plasma CVD method has widely been used and industrialized.

However, for the deposited film constituted of amorphous silicon, amorphous germanium, etc. there is room left for further improvement of overall characteristics with respect to electrical or optical characteristics and fatigue characteristic during repeated uses, or use in various kinds of environmental characteristic, further productivity and mass improved productivity including uniformity and reproducibility.

The reaction process in formation of an amorphous silicon deposited film, an amorphous germanium deposited film, etc. according to the plasma CVD method generalized in the prior art is considerably complicated as compared with the CVD method of the prior art, and more than a few ambiguities existed in its reaction mechanism. Also, there are a large number of parameters involved for formation of such a deposited film (e.g. substrate temperature, flow rates and ratios of gases introduced, pressure during film formation, high frequency power, electrode structure, structure of reaction vessel, gas discharging speed, plasma generation system, etc.). The plasma formed by combination of such numerous parameters may sometimes become unstable to frequently give markedly bad properties to the deposited film formed. Besides, the parameters inherent in the device must be determined for each device, and it has been difficult under the present situation to generalize the production conditions. On the other hand, for exhibiting electrical, photoconductive or mechanical characteristics of an amorphous silicon film, an amorphous germanium film, etc. satisfactorily for respective uses, it has been deemed best to form such a film according to the plasma CVD method under the present situation.

However, depending on the applied uses of the deposited film, since it is required to meet sufficiently requirements of enlargement of area, uniformization of film thickness and uniformity of film quality, and also to attempt to perform a mass production with reproducibility by a high speed film formation, enormous equipment capital becomes necessary for mass production devices in formation of amorphous silicon deposited film, amorphous germanium deposited films, etc. according to the plasma CVD method. The management items for mass production thereof are complicated making tolerances for mass production narrower. These matters, and also subtlety in adjustment of the devices, have been pointed out as the problems improvement in the future. On the other hand, in conventional CVD method of the prior art, high temperature is required to be used and no deposited film having practical characteristics could be obtained.

As described above, in formation of amorphous silicon films, amorphous germanium films, etc. it has earnestly been desired to develop a synthesis process which can perform mass production by means of a low cost device while maintaining practical characteristics and uniformity. These discussions may also be applicable to other functional films such as silicon nitride films, silicon carbide films, silicon oxide films, etc.

SUMMARY OF THE INVENTION

The present invention provides a novel process for formation of a deposited film which removes the drawbacks of the plasma CVD method as described above and also uses no formation method of the prior art.

An object of the present invention is to provide a process for forming a deposited film which is suitable for enlargement of the film and can easily accomplish improvement of productivity and mass production of the film, while attempting to improve the characteristics of the film formed, the film forming speed and reproducibility and also to uniformize film quality.

According to the present invention, there is provided a process for forming a deposited film, which comprises introducing into a deposition space for formation of a deposited film on a substrate an active species (A) formed by decomposition of a compound containing carbon and a halogen and an active species (B) formed from a chemical substance for film formation which is chemically mutually reactive with said active species (A) separately from each other, and then permitting the both species to react chemically with each other thereby to form a deposited film on the substrate.

DESCRIPTION OF THE PREFERRED EMBODIMENTS

Figure 1:
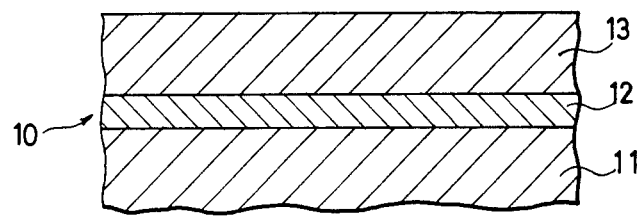
FIG. 1 is a schematic sectional view for illustration of a construction example of the image forming member for electrophotography produced by use of the process of the present invention.

In the process of the present invention, since no plasma is excited in the film forming space for formation of a deposited film, the deposited film formed is free from bad influence by etching action or other actions such as abnormal discharging action, contamination with impurities from the inner wall surface of the film forming chamber, etc.

Also, according to the present invention, by controlling the atmosphere temperature in the film forming space and the substrate temparature as desired, the CVD process can be made more stable.

One of the points in which the process of the present invention is different from the CVD process of the prior art is to use active species obtained by being previously activated in a space different from the film forming space (hereinafter referred to as activation space). By doing so, the film forming speed can be dramatically increased as compared with the CVD method of the prior art. In addition, the substrate temperature during film formation can be lowered to a great extent, whereby deposited films with stable film quality can be provided commercially in a large amount and yet at low cost.

The term active species (A) as herein mentioned refers to those having the action of promoting formation of deposited films by causing chemical mutual actions with the active species (B) formed from a compound for formation of a deposited film, thereby imparting energy or causing chemical reactions to occur. Thus, the active species (A) may either contain the constituent elements which become the constituent elements constituting the deposited film to be formed or contain no such constituent element.

In the present invention, the active species (A) from the activation space (A) should preferably be selected and used as desired from those having a life of 0.1 sec. or longer more preferably 1 sec. or longer, optimally 10 sec. or longer, from the standpoint of productivity and easiness in handling.

In the present invention, as the compound containing carbon and halogen to be introduced into the activation space (A), there may be employed, for example, chain or cyclic hydrocarbons of which hydrogen atoms are partially or wholly substituted with halogen atoms, typically chain carbon halides represented by $C_uY_{2u+2}$ (u is an integer of 1 or more, Y is at least one element selected from F, Cl, Br and I) cyclic carbon halides represented by $C_vY_{2v}$ (v is an integer of 3 or more, and Y has the same meaning as defined above), and chain or cyclic compounds represented by $C_uH_xY_y$ (u and Y have the same meanings as defined above, $x+y=2u$ or $2u+2$).

Specific examples may include gaseous or readily gasifiable compounds such as $CF_4$, $(CF_2)_4$, $(CF_2)_5$, $(CF_2)_6$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Cl_3F_3$ and the like.

Also, in the present invention, in addition to the active species (A) formed by decomposition of the compound containing carbon and a halogen, it is also possible to use active species (SX) formed by decomposition of a compound containing silicon and a halogen in combination.

As the compound containing silicon and a halogen, there may be employed, for example, chain or cyclic hydrogenated silicon of which hydrogen atoms are partially or wholly substituted with halogen atoms, typically chain silicon halides represented by $Si_uZ_{2u+2}$ (u is an integer of 1 or more, Z is at least one element selected from F, Cl, Br and I), cyclic silicon halides represented by $Si_vZ_{2v}$ (v is an integer of 3 or more, and has the same meaning as defined above), and chain or cyclic compounds represented by $Si_uH_xZ_y$ (u and Z have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

For formation of the active species (A), in addition to the above compound containing carbon and halogen, (and the compound containing silicon and halogen), other silicon compounds such as single substance of silicon, etc., hydrogen, a halogen compound (e.g., $F_2$ gas, $Cl_2$ gas, gasified $Br_2$, $I_2$, etc.) may be used in combination.

As the chemical substance for film formation for forming the active species (B) used in the present invention, there may be included those containing the constituent elements which become the constituent elements constituting the deposited film to be formed and functioning as a starting material for formation of the deposited film or those not containing the constituent elements which become the constituent elements constituting the deposited film to be formed and capable of being considered to merely contribute to film formation. The compounds functioning as a starting material for formation of the deposited film and the compounds contributing to film formation may be used in combination.

The chemical substance for film formation to be used in the present invention may preferably be already gaseous or made gaseous before introduction into activation space (B). For example, when a liquid compound is used, a suitable gasfying device can be connected to the source for supplying the compound, and the compound can be gasified before introduction into the activation space (B).

In the activation space (B) to be used in the process of the present invention, as the above chemical substance for film formation for forming active species (B), hydrogen gas and/or a halogen compound (e.g. $F_2$ gas, $Cl_2$ gas, gasified $Br_2$, $I_2$, etc.) may be advantageously employed. Also, in addition to these chemical substances for film formation, an inert gas such as helium, argon, neon, etc. may be used. When a plurality of these chemical substances for film formation are to be employed, they can be previously mixed before introduction into the activation space (B), or alternatively these chemical substances can individually be supplied from feeding sources independent of each other to be introduced into the activation space (B), or into independent respective activation spaces to be individually activated therein.

In the activation space (B) to be used in the process of the present invention, as the above chemical substance for film formation for forming active species (B), there may also be advantageously employed silicon containing compounds, carbon containing compounds, germanium containing compounds, oxygen containing compounds and nitrogen containing compounds.

The silicon containing compound may include silanes and siloxanes having hydrogen, halogen and hydrocarbon groups bonded to silicon Above all, chain and cyclic silane compounds, or these chain and cyclic silane compounds of which hydrogen atoms are substituted partially or wholly with halogen atoms are preferred.

Specifically, there may be included, for example, straight chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc. which may be substituted with halogen; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc. which may be substituted with halogen; and cyclic silane compounds represented by $Si_qH_{2q}$ (q is an integer of 3 or more, preferably 3 to 6) such as $Si_3H_6$, $Si_4H_8$, $Si_5H_{10}$, $Si_6H_{12}$, etc. which may be substituted with other cyclic silanyl groups and/or chain silanyl groups. Examples of the above silane compounds in which a part or all of the hydrogen atoms are substituted with halogen atoms may include halo-substituted chain or cyclic silane compounds represented by $Si_rH_sX_t$ (X is a halogen atom, r is an integer of 1 or more, preferably 1 to 10, more preferably 3 to 7, s+t=2r+2 or 2r) such as $SiH_3F$, $SiH_3Cl$, $SiH_3Br$, $SiH_3I$, etc. These compounds may be used either alone or as a combination of two or more compounds.

In the above case, in addition to the silicon containing compounds for film formation, it is possible to introduce one or more kinds of the aforesaid hydrogen gas, a halogen compound (e.g. $F_2$ gas, $Cl_2$ gas, gasified $Br_2$, $I_2$, etc.) and an inert gas such as helium, argon, neon, etc. into the activation space (B). When a plurality of these chemical substances for film formation are to be employed, they can be previously mixed before introduction into the activation space (B), or alternatively these starting gases can individually be supplied from feeding sources independent of each other to be introduced into the activation space (B), or into independent respective activation spaces to be individually activated therein.

As the carbon containing compound, there may be employed preferably gaseous or readily gasifiable compounds selected from chain or cyclic saturated or unsaturated hydrocarbon compounds, organic compounds containing carbon and hydrogen as main constituent atoms and additionally containing at least one of halogen, sulfur, etc. as constituent atoms, and organic silicon compounds containing hydrocarbon groups as constituent components or having siliconcarbon bonds.

Among them, as hydrocarbon compounds, there may be enumerated saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

As halo-substituted hydrocarbon compounds, there may be enumerated compounds in which at least one of hydrogen atoms which are constituents of the above hydrocarbon compounds are substituted with F, Cl, Br or I, particularly those in which hydrogen is substituted with F or Cl, as effective ones.

The halogens substituted for hydrogen may be either one kind or two or more kinds in one compound.

As organic silicon compounds to be used in the present invention may include organosilanes and organohalogenosilanes.

Organosilanes and organohalogenosilanes are compounds represented, respectively, by the general formulae:

$$R_nSiH_{4-n} \text{ and } R_mSiX_{4-m}$$

wherein R is alkyl or aryl; X is F, Cl, Br or I; n=1,2,3 or 4; and m=1,2 or 3, including typically alkylsilanes, arylsilanes, alkylhalogenosilanes, and arylhalogenosilanes.

| Specific example of organochlorosilanes include | |
|---|---|
| trichloromethylsilane | $CH_3SiCl_3$, |
| dichlorodimethylsilane | $(CH_3)_2SiCl_2$, |
| chlorotrimethylsilane | $(CH_3)_3SiCl$, |
| trichloroethylsilane | $C_2H_5SiCl_3$ and |
| dichlorodiethylsilane | $(C_2H_5)_2SiCl_2$. |
| Specific examples of organochlorofluorosilanes include | |
| chlorodifluoromethylsilane | $CH_3SiF_2Cl$, |
| dichlorofuloromethylsilane | $CH_3SiFCl_2$, |
| chlorofulorodimethylsilane | $(CH_3)_2SiFCl$, |
| chloroethyldifluorosilane | $(C_5H_5)SiF_2Cl$, |
| dichloroethylfluorosilane | $C_2H_5SiFCl_2$, |
| chlorodifluoropropylsilane | $C_3H_7SiF_2Cl$ and |
| dichlorofluoropropylsilane | $C_3H_7SiFCl_2$. |
| Specific examples of organosilanes include | |
| tetramethylsilane | $(CH_3)_4Si$, |
| ethyltrimethylsilane | $(CH_3)_3SiC_2H_5$, |
| trimethylpropylsilane | $(CH_3)_3SiC_3H_7$, |
| triethylmethylsilane | $CH_3Si(C_2H_5)_3$ and |
| tetraethylsilane | $(C_2H_5)_4Si$. |
| Specific examples of organohydrogenosilanes include | |
| methylsilane | $CH_3SiH_3$, |
| dimethylsilane | $(CH_3)_2SiH_2$, |
| trimethylsilane | $(CH_3)_3SiH$, |
| diethylsilane | $(C_2H_5)_2SiH_2$, |
| triethylsilane | $(C_2H_5)_3SiH$, |
| tripropylsilane | $(C_3H_7)_3SiH$ and |
| diphenylsilane | $(C_6H_5)_2SiH_2$. |
| Specific examples of organofluorosilanes include | |
| trifluoromethylsilane | $CH_3SiF_3$, |
| difluorodimethylsilane | $(CH_3)_2SiF_2$, |
| fluorotrimethylsilane | $(CH_3)_3SiF$, |
| ethyltrifluorosilane | $C_2H_5SiF_3$, |
| diethyldifluorosilane | $(C_2H_5)_2SiF_2$, |
| triethylfulorosilane | $(C_2H_5)_3SiF$ and |
| trifluoropropylsilane | $(C_3H_7)SiF_3$. |
| Specific examples of organobromosilanes include | |
| bromotrimethylsilane | $(CH_3)_3SiBr$ and |
| dibromodimethylsilane | $(CH_3)_2SiBr_2$. |
| In addition, it is also possible to use organopolysilanes such as | |
| organodisilanes such as | |
| hexamethyldisilane | $[(CH_3)_3Si]_2$ and |
| hexapropyldisilane | $[(C_3H_7)_3Si]_2$. |

These carbon containing compounds may be used either alone or as a combination of two or more compounds.

In the above case, in addition to the carbon containing compounds, one or more kinds of hydrogen halogen compounds (e.g. $F_2$ gas, $Cl_2$ gas, gasified $Br_2$, $I_2$, etc.) inert gases such as helium, neon, argon, etc. and the aforesaid silicon compounds may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the germanium containing compounds, there may be employed inorganic or organic germanium containing compounds having hydrogen, halogens or hydrocarbon groups bonded to germanium, as exemplified by organic germanium compounds such as chain or cyclic hydrogenated germanium represented by $Ge_aH_b$ (a is an integer of 1 or more, b=2a+2 or 2a); polymers of the hydrogenated germanium; compounds in which a part or all of the hydrogen atoms in the above hydrogenated germanium are substituted with halogen atoms; compounds in which a part or all of the hydrogen atoms in the above hydrogenated germanium compounds are substituted with organic groups such as alkyl groups, aryl groups, etc. or, if desired, halogen atoms; etc. and inorganic germanium compounds such as sulfide, imides, etc.

Specifically, there may be enumerated, for example, $FeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6GeF_6$, $Ge(CH_3)_4$, $Ge(C_2H_5)_4$, $CH_3GeH_3$, $(CH_3)_2GeH_2$, $(CH_3)_3GeH$, $(C_2H_5)_2GeH_2$, $Ge(CH_3)_2F_2$, $GeF_2$, $GeF_4$, $GeS$, $Ge_3N_4$, $Ge(NH_2)_2$, etc.

These germanium compounds may be used either alone or as a combination of two or more compounds.

In the above case, in addition to the germanium containing compounds, one or more kinds of hydrogen, a halogen compound (e.g. $F_2$ gas, $Cl_2$ gas, gasified $Br_2$, $I_2$, etc.), an inert gas such as helium, neon, argon, etc. compounds aforesaid silicon containing compounds or carbon containing may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the oxygen containing compound, there may be mentioned compounds containing oxygen atoms and at least one atom other than oxygen as constituent atoms. Other atoms than oxygen as mentioned above include hydrogen (H), halogens (X=F, Cl, Br or I), sulfur (S), carbon (C), silicon (Si), germanium (Ge), phosphorus (P), boron (B), alkali metals, alkaline earth metals, transition metals, etc. In addition, still other atoms, of elements belonging to the respective groups in the periodic table, which can be bonded to an oxygen atom may be available.

For example, as compounds containing O and H, there may be enumerated $H_2O$, $H_2O_2$, etc.; as compounds containing O and S, oxides such as $SO_2$, $SO_3$, etc.; as compounds containing O and C, oxides such as $CO$, $CO_2$, etc.; as compounds containing O and Si, siloxanes such as disiloxane ($H_3SiOSiH_3$), trisiloxane ($H_3SiOSiH_2OSiH_3$), etc., organoacetoxylilanes such as diacetoxydimethylsilane $(CH_3)_2Si(OCOCH_3)_2$, triacetoxymethylsilane $CH_3Si(OCOCH_3)_3$, etc., alkylalkoxysilanes such as methoxytrimethylsilane $(CH_3)_3SiOCH_3$, dimethoxydimethylsilane $(CH_3)_2Si(OCH_3)_2$, trimethoxymethylsilane $CH_3Si(OCH_3)_3$), etc.; organosilanols such as trimethylsilanol $(CH_3)_3SiOH$, dimethylphenyl silanol $(CH_3)_2(C_6H_5)SiOH$, diethylsilanediol $(C_2H_5)_2Si(OH)_2$, etc.; as compounds containing O and Ge, oxides, hydroxides of Ge, germanic acids, organic germanium compounds such as $H_3GeOGeH_3$, $H_3GeOGeH_2OGeH_3$, etc., but the oxygen containing compounds to be used in the present invention are not limited to these compounds.

These oxygen containing compounds may be used either alone or as a combination of two or more compounds.

Also, it is possible to sue gases other than these compounds such as $O_2$, $O_3$, etc.

In the above case, in addition to the oxygen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds or germanium containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

As the nitrogen containing compound, there may be included compounds containing nitrogen atoms and at least one atom other than nitrogen as constituent atoms. Other atoms than nitrogen as mentioned above include hydrogen (H), halogens (X=F, Cl, Br or I), sulfur (S), carbon (C), oxygen (O), phosphorus (P), silicon (Si), germanium (Ge), boron (B), alkali metals, alkaline earth metals, transition metals, etc. In addition, still other atoms, of elements belonging to the respective groups in the periodic table, which can be bonded to an nitrogen atom may be available.

For example, as compounds containing N and H, there may be enumerated $NH_3$, $NH_4H_3$, $N_2H_5N_3$, $H_2NNH_2$, primary to tertiary amines, halides of these amines, hydroxylamine, etc.; as compounds containing N and X, $N_3X$, $N_2X_2$, $NX_3$, $NOX$, $NO_2X$, $NO_3X_4$, etc.; as compounds containing N and S, $N_4S_4$, $N_2S_5$, etc.; as compounds containing N and C, $N(CH_3)_3$, HCN and cyanides, HOCN and salts thereof, etc.; as compounds containing N and O, $N_2O$, NO, $NO_2$, $N_2O_3$, $N_2O_4$, $N_2O_5$, $NO_3$, etc; as compounds containing N and P, $P_3N_5$, $P_2N_3$, PN, etc. In addition, there may also be employed organosilazanes such as triethylsilazane $(C_2H_5)_3SiNH_2$, hexamethyldisilazane $[(CH_3)_3Si]_2NH$, hexaethyldisilazane $[(C_2H_5)_3Si]_2NH$, etc.; organosilicon isocyanates such as trimethylsilicon isocyanate $(CH_3)_3SiNCO$, dimethylsilicon diisocyanate $(CH_3)_2Si(NCO)_2$, etc.; organosilicon isothiocyanates such as trimethylsilicon isothiocyanate $(CH_3)_3SiNCS$, etc. The nitrogen containing compound is not limited to these compounds provided that the compound is fit for attaining the object of the present invention.

These nitrogen containing compounds may be used either alone or as a combination of two or more compounds. Also, it is possible to use $N_2$ gas.

In the above case, in addition to the nitrogen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds, germanium containing compounds or oxygen containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

In the present invention, the proportion in amount of the active species (A) to the active species (B) in the film forming space may suitably be determined depending on the depositing conditions, the kind of activated species, etc., but may preferably be 10:1 to 1:10, more preferably 8:2 to 4:6.

In the present invention, as the method for forming activate species (A) and (B) in the activation spaces (A) and (B), respectively, there may be employed various activation energies such as electrical energies including microwave, RF, low frequency, DC, etc., heat energies including heater heating, IR-ray heating, etc., optical energies and the like in view of the respective conditions and the device.

On the other hand, the deposited film formed according to the present invention can be doped with impurity elements during or after film formation. As the impurity elements to be used, there may be employed, as p-type impurities, elements belonging to group III A of the periodic table such as B, Al, Ga, In, Tl, etc. and, as n-type impurtties, elements belonging to group VA of the periodic table such as N, P, As, Sb, Bi, etc. as suitable ones. Particularly, B, Ga, P and Sb are most preferred. The doping amount of impurities may be determined suitably depending on the desired electrical and optical characteristics.

Among compounds containing such impurity atoms as the components, it is preferable to select a compound which is gaseous under normal temperature and normal pressure, or gaseous at least under the activating conditions, or a compound which can be readily gasified by a suitable gasifying device. Such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.. The compounds containing impurity atoms may be used either alone or as a combination of two or more compounds The substances for introduction of impurities may be introduced into the activation space (A) and/or the activation space (B) together with the respective substances for formation of the active species (A) and the active species (B) to be activated therein alternatively activated in a third activation space (C) separate from the activation space (A) and the activation space (B). The substance for introduction of impurity can be employed by selecting suitably the activation energy as described above. The active species formed by activation of the substance for introduction of impurity (PN) may be previously mixed with the active species (A) and/or the active species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

Photoconductive member 10 shown in FIG. 1 is applicable as an image forming member for electrophotography, and has a layer constitution consisnting of intermediate layer 12 which may optionally be provided and photosensitive layer 13 provided on substrate 11 for photoconductive member.

In preparation of the photoconductive member 10, intermediate layer 12 and/or the photosensitive member 13 can be prepared according to the process of the present invention. Further, when the photoconductive member 10 has an protective layer provided for the purpose of protecting chemically or pshysically the surface of the photosensitive layer 13, or a lower barrier layer and/or an upper barrier layer provided for improving dielectric strength, these layers can also be prepared according to the process of the present invention.

The substrate 11 may be either electroconductive or insulating. As electroconductive substrates, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and so on. At least one side surface of these substrates is preferably subjected to treatment for imparting electroconductivity, and it is desirable to form other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$), etc. thereon. Alternatively, a synthetic resin film such as a polyester film can be subjected to the electroconducitve treatment on its surface by, for example, vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with the said metal, thereby imparting electroconductivity to the surface. The substrate may be shaped in any form such as cylinders, belts, plates or others, and its form may be determined as desired. For example, when the photoconductive member 10 in FIG. 1 is to be used as a light-receiving member for electrophotography, it may desirably be formed into an endless belt or a cylinder for use in continuous high speed copying.

For example, the intermediate layer 12 has the function of impeding effectively inflow of the carriers from the side of the substrate 11 into the photosensitve layer 13 and permitting easy passage of the photocarriers, formed in the photosensitive layer 13 by irradiation of electromagnetic wave and migrating toward the side of the substrate 11, from the side of the photosensitive layer 13 to the side of the substrate 11.

The intermediate layer 12 may be consitituted of, for example, amorphous carbon containing carbon atoms, hydrogen atoms(H) and/or halogen atoms(X), as constituent atoms (hereinafter written as "A-C(H, X)"); amorphous silicon containing hydrogen atoms (H) and/or halogen atoms (X) (hereinafter written as A-Si(H,X)); an amorphous material containing silicon atoms and carbon atoms, optionally together with hydrogen atoms (H) and/or halogen atoms (X), as constitutent atoms (hereinafter written as "A-SiC(H,X)"); amorphous germanium containing optionally silicon atoms (Si), hydrogen atoms (H), halogen atoms (X) and carbon atoms (C) as constituent atoms (hereinafter written as "A-Ge(Si, H, X, C)"); an amorphous material containing silicon atoms, oxygen atoms and carbon atoms, optionally together with hydrogen atoms (H) and/or halogen atoms (X), as constituent atoms (hereinafter written as "A-SiOC(H, X)"); an amorphous material containing silicon atoms, nitrogen atoms and carbon atoms, optionally together with oxygen atoms, hydrogen atoms (H) and/or halogen atoms (X) as constituent atoms (hereinafter written as "A-SiNC(O, H, X)"), etc. and at the same time can sometimes contain, for example, a p-type impurity such as B or an n-type impurity such as P as a substance for controlling electroconductivity, if necessary.

In the present invention, the content of substances controlling conductivity such as B, P, etc. contained in the intermediate layer 12 may preferably be 0.001 to $5 \times 10^4$ atomic ppm, more preferably 0.5 to $1 \times 10^4$ atomic ppm, optimally 1 to $5 \times 10^3$ atomic ppm.

In the case of forming the intermediate layer 12, as starting materials for formation of the intermediate layer, active species (A) formed in activation space (A) and active species (B) formed in activation space (B), optionally together with active species formed by activation of hydrogen, halogens, inert gases, gases of silicon containing compounds, germanium containing compounds, carbon containing compounds, compounds containing impurity elements as components, etc. may be introduced respectively and separately into the film forming space, in which the substrate 11 is placed, and the intermediate layer 12 may be formed on the substrate 11 by causing a chemical reaction.

The compound containing carbon and halogen capable of forming active species (A) by introduction into the activation space (A) during formation of the intermediate layer 12 should desirably be one seleted from the compounds as mentioned above which can form readily active species such as, for example, $CF_2^*$. Similarly, as the compound containing silicon and halogen, it is desirable to select a compound from the compounds as mentioned above which can form readily active species such as, for example $SiF_2^*$.

The intermediate layer 12 should have a layer thickness preferably 30 Å to 10 $\mu$, more preferably 40 Å to 8 $\mu$, optimally 50 Å to 5 $\mu$.

The photosensitive layer 13 is constituted of, for example, an amorphous material having a matrix of silicon atoms and optionally containing hydrogen atoms and/or halogen atoms (X) as constituent atoms (hereinafter referred to as "A-Si(H,X)"); an amorphous material having a matrix of silicon atoms and carbon atoms and optionally containing hydrogen atoms (H) and/or halogen atoms (X) (hereinafter referred to as "A-SiC(H,X)); an amorphous material having a matrix of silicon atoms and optionally containing hydrogen, halogen germanium, carbon, etc. as constituent atoms (hereinafter referred to as A-Si(H, X, Ge, C) and amorphous material having a matrix of silicon atoms and germanium atoms optionally containing hydrogen, halogen, carbon, etc. (A-SiGe(H,X,C)) and the like, and has both functions of the charge generation function of generating photocarriers by irradiation of laser beam and the function of transporting the charges.

The photosensitive layer 13 should have a layer thickness preferably of 1 to 100 $\mu$, more preferably 1 to 80 $\mu$, optimally 2 to 50 $\mu$.

The photosensitive layer 13 is constituted of non-doped A-Si(H,X), A-SiC(H,X), A-Si(H,X,Ge,C), A-SiGe(H,X,C), etc. but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be practiced, similarly as in the case of the intermediate layer 12, if it is to be prepared according to the process of the present invention, by introducing a compound containing carbon and halogen and separately a compound containing silicon and halogen into the activation space (A), decomposing these under a high temperature or exciting these through the action of discharging energy or light energy to form active species (A) and introducing said active species (A) into deposition space.

In the case of forming a intermediate layer 12 which is similar to or the same in constituents as the photosensitive layer 13, up to formation of the photoconductive layer 13 can continuously be performed subsequent to formation of the intermediate layer 12.

Further, if desired, it is also possible to form an amorphous deposited film containing carbon and silicon as constituent atoms as the surface layer on the photosensitive layer and, in this case, film formation can also be conducted according to the process of the present invention, similarly as the above intermediate layer and photosensitive layer.

Figure 2:
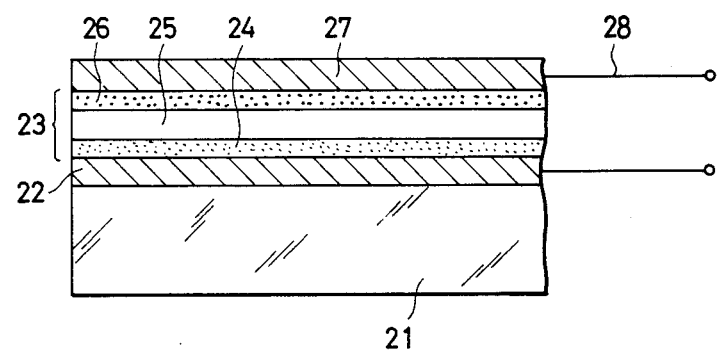
FIG. 2 is a schematic sectional view for illustration of a construction example of a PIN type diode produced by use of the process of the present invention.

FIG. 2 is a schematic illustration showing a typical example of a PIN type diode device utilizing a deposited film doped with an impurity element prepared by carrying out the process of the present invention.

In the drawing, 21 is a substrate, 22 and 27 are thin film electrodes, 23 is a semiconductor film consisting of an n-type semiconductor layer 24, an i-type semiconductor layer 25 and a p-type A-Si semiconductor layer 26. While the present invention may be applicable for preparation of any one layer of the semiconductor layers 24, 25 and 26, particularly the semiconductor layer 26 can be prepared according to the process of the present invention to enhance conversion efficiency. When the semiconductor layer 26 is prepared by the process of the present invention, the semiconductor layer 26 can be constructed of, for example, an amorphous material containing silicon atoms, carbon atoms, hydrogen atoms and/or halogen atoms as constituent atoms (hereinafter referred to as "A-SiC(H,X)"); an amorphous material containing silicon atoms, carbon atoms, germaniun atoms, hydrogen atoms and/or halogen atoms as constituent atoms (hereinafter referred to as "A-SiGeC(H,X)"); an amorphous material containing silicon atoms, carbon atoms, oxygen atoms, hydrogen atoms and/or halogen atoms as constituent atoms (hereinafter referred to as "A-SiCO(H,X)"); an amorphous material containing silicon atoms, nitrogen atoms, carbon atoms, hydrogen atoms and/or halogen atoms (hereinafter referred to "A-SiNC(H,X)"),etc.. 28 is a conductive wire to be connected to the external electrical circuit.

As the substrate 21, there may be employed a conductive, semiconductive or insulating substrate.

When the substrate 21 is conductive, the thin film electrode 22 may be omitted. As the semiconductive substrate, there may be employed, for example, semiconductors such as Si, Ge, GaAs, ZnO, ZnS, etc.. Thin film electrodes 22, 27 can be obtained by forming thin films of NiCr, Al, Cr, Mo, Au, Ir, Nb, Ta, V, Ti, Pt, Pd, $In_2O_3$, $SnO_2$, $ITO(In_2O_3+SnO_2)$, etc. on the substrate 21 by treatment such as vacuum deposition, electron beam vapor deposition, sputtering, etc . The electrodes 22, 27 have a film thickness preferably of 30 to $5 \times 10^4$ Å, more preferably 100 to $5 \times 10^3$ Å.

For rendering the film constituting the semiconductor layer n-type or p-type, if desired, it can be formed by doping an n-type impurity or a p-type impurity or both impurities into the layer to be formed, while controlling its amount, during layer formation.

For formation of n-type, i-type and p-type semiconductor layers, any one or all of the layers can be formed by the process of the present invention, with the film formation being performed by introducing a compound containing carbon and halogen are introduced into the activation space (A) and decomposing these by the action of an activation energy, whereby active species (A) of, for example, $CF_2^*$, $SiF_2^*$, etc. can be formed and introduced into the film forming space. Also, separately, a gaseous carbon containing compound and a silicon containing compound, optionally together with an inert gas and a gas containing an impurity element as the component, may be excited and decomposed, if desired, by respective activation energies to form respective active species, which are then separately or in an appropriate mixture introduced into the film forming space in which substrate 11 is placed to form a deposited film. The n-type and p-type semiconductor layers should have a layer thickness preferably of 100 to $10^4$ Å, more preferably 300 to 2000 Å. On the other hand, the i-type semiconductor layer should preferably have a layer thickness preferably of 500 to $10^4$ Å, more preferably 1000 to 10000 Å.

The PIN type diode device shown in FIG. 2 is necessarily required to prepare all the layers of P, I and N according to the process of the present invention, but the present invention can be carried out by preparing at least one layer of P, I and N according to the process of the present invention.

According to the process for forming a deposited film of the present invention, electrical, optical photoconductive and mechanical charactristics desired for the film to be formed can be improved, and yet a high speed film formation is possible without maintaining the substrate at a high temperature. Also, reproducibility in film formation can be improved to enable improved of the film quality and uniformization of the film quality, and the process is also advantageous in enlargement of area of the film and can easily accomplish improvement of productivity of films as well as bulk production of films. Further, since no special excitation energy is used during film formation, there can be exhibited such effects that film formation can be effected also on a substrate which is poor in heat resistance of susceptible to plasma etching action, and that the steps can be shortened by low temperature treatment.

The present invention is described in detail by referring to the following Examples.

EXAMPLE 1

Carbon-containing amorphous deposited films of i-, p- and n-types were prepared in the following manner with an apparatus shown in FIG. 3.

Figure 3:
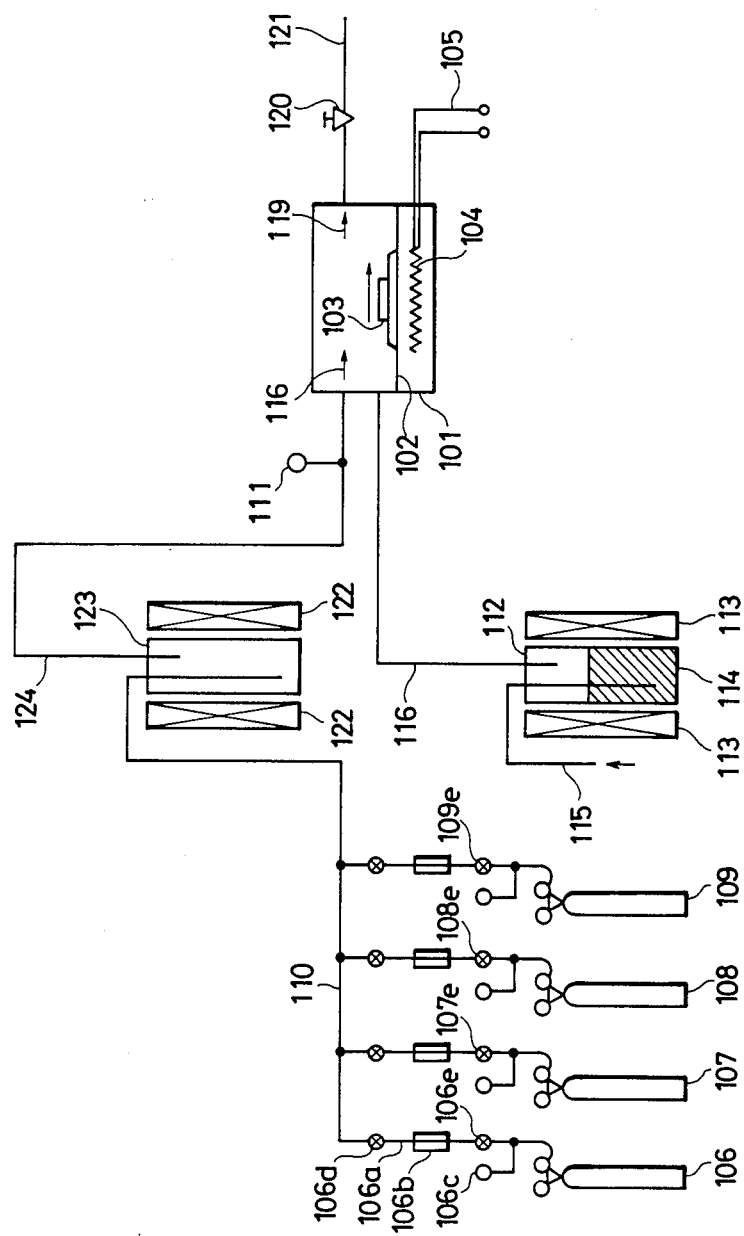
FIG. 3 and FIG. 4 are schematic diagrams for illustration of the constitutions of the devices for practicing the process of the present invention employed in respective examples

In FIG. 3, a desired substrate 103 is placed on a substrate support 102 in a film forming chamber 101.

A heater 104 is used for heating the substrate prior to film formation, or for annealing for improving the characteristics of the film after formation thereof, and is powered through wires 105. The temperature of the substrate is not particularly specified but is preferably in a range of 50° to 150° C., more preferably in a range of 100° to 150° C. in carrying out the process of the present invention.

Gas sources 106 to 109 are suitably provided according to the species of a gas of film forming material, an inert gas employed when required, a gas of an impurity-containing compound etc. If said gasses are liquid in standard condition, suitable gasifiers are provided. In each of said gas supply systems 106–109, there are provided a branched pipe a, a flow meter b, a pressure gauge c for measuring the pressure of the high-pressure side of said flow meter, and flow rate regulating valves d, e. Around an activation chamber (B) 123 for generating an active species (B), there is provided a microwave plasma generator 122 for generating the activating energy for said active species formation. A raw material gas for active species formation, supplied from a gas pipe 110, is activated in the activation chamber 123, and the resulting active species (B) is introduced, through a pipe 124, into the film forming chamber 101. 111 indicates a gas pressure gauge.

There are further provided an activation chamber (A) 112, an electric furnace 113, solid carbon particles 114, and a pipe 115 for introducing a gaseous compound containing carbon and halogen, employed as a raw material for forming the active species (A). The active species (A) formed in the activation chamber (A) 112 is introduced into the film forming chamber 101 through a pipe 116.

There are further shown an exhaust valve 120 and an exhaust pipe 121.

At first a substrate 103, composed of a polyethylene terephthalate film, was placed on the support 102, and the film forming chamber 101 was evacuated to a pressure of $10^{-6}$ Torr with a vacuum pump. 150 sccm of $H_2$ gas, optionally mixed with 40 sccm of $PH_3$ gas or $B_2H_6$ gas (each diluted to 1000 ppm with hydrogen gas), was introduced from the gas bomb 106, through a gas pipe 110, into the activation chamber (B) 123. The $H_2$ gas etc. introduced into the activation chamber (B) 123 was activated by the microwave plasma generator 122 to form activated hydrogen etc. which were introduced into the film forming chamber 101 through a pipe 124.

On the other hand, the activation chamber (A) 102 was filled with solid carbon particles 114 and heated with the electric furnace 113 at ca. 1000° C. to maintain said carbon particles at a red heat state, and $CF_4$ was blown through a pipe 115 from a bomb (not shown) to form an active species $CF_2^*$ which was introduced into the film forming chamber 101 through a pipe 116.

In this manner the pressure in the film forming chamber 101 was maintained at 0.3 Torr to form a non-doped or doped carbon-containing amorphous film A-C(H,X) of a thickness of 700 Å, with a film forming speed of 10 Å/sec.

Then the specimen having a non-doped or p-type film A-C(H,X) thus formed was placed in an evaporation chamber for forming comb-shaped Al-gap electrodes (gap length 250 μm, width 5 mm) at a pressure of $10^{-5}$ Torr, and is then subjected to the measurement of a dark current at an applied voltage of 10 V, to determine the dark conductivity $\sigma_d$. Table 1A summarizes the film characteristics of the specimens evaluated from said dark conductivity.

EXAMPLE 2

A carbon-containing amorphous film A-C(H,X) was prepared by reproducing the method and procedure of the Example 1, except that in addition to the $H_2$ gas from the gas bomb 106, $F_2$ gas was introduced (gas volume ratio $H_2/F_2=15$). Table 1A shows the results of measurement of dark conductivity on the specimens.

Table 1A indicates that the present invention can provide a carbon-containing amorphous film excellent in electrical properties, and also provide a carbon-containing amorphous film with sufficient doping.

EXAMPLE 3

An electrophotographic drum-shaped image-forming member of a layer structure as shown in FIG. 1 was prepared in the following manner, with an apparatus shown in FIG. 4.

Figure 4:
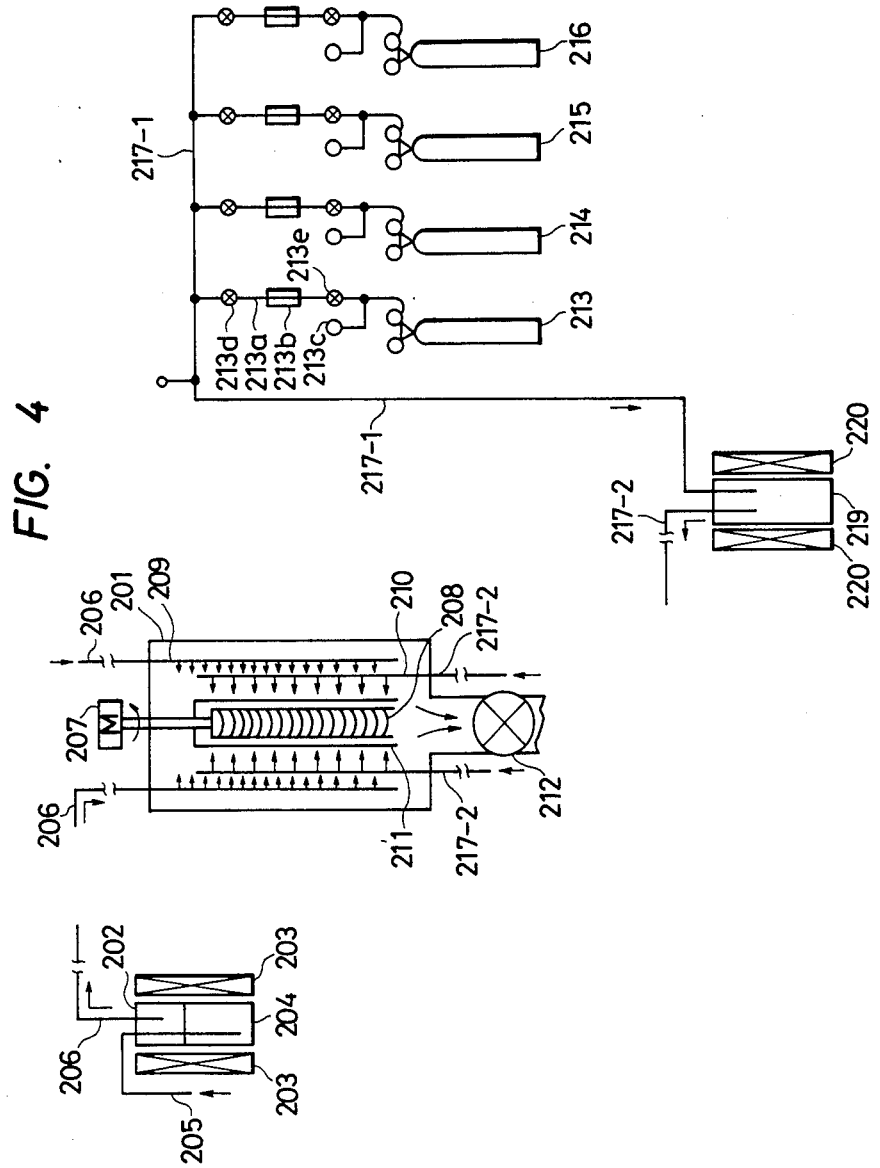

In FIG. 4, there are shown a film forming chamber 201; an activation chamber (A) 202; an electric furnace 203; solid carbon particles 204; a pipe 205 for introducing a raw material for the active species (A); a pipe 206 for introducing the active species (A); a motor 207; a heater 208 employed in a similar manner as the heater 104 shown in FIG. 3; blow-off pipes 209, 210; a substrate 211 formed as an Al-cylinder; an exhaust valve 212; gas sources 213-216 similar to those 106-109 shown in FIG. 3; and a gas supply pipe 217-1.

The Al-cylindrical substrate 211 was suspended, with the heater 208 therein and in such a manner as to be rotatable with the motor 207, in the film forming chamber 201.

The activation chamber (A) 202 was filled with the solid carbon particles 204 and heated by the electric furnace 203 at ca. 1000° C. to maintain the carbon particles at a red heat state, and $CF_4$ was blown through a pipe 206 from a bomb (not shown) to form an activated species $CF_2^*$, which was introduced into the film forming chamber 201 through the pipe 206. Also an active species (C) $SiF_2^*$, formed similarly from solid silicon particles and $SiF_4$ was introduced from an unrepresented activation chamber (C) of a structure similar to that of the activation chamber (A) 202.

On the other hand, $H_2$ gas was introduced, through the pipe 217-1, into an activation chamber (B) 219, and activated therein by a microwave plasma generator 220 to generate active hydrogen, which was introduced into the film forming chamber 201, through a pipe 217-2. Simultaneously an impurity gas such as $PH_3$ or $B_2H_6$ was introduced into the activation chamber (B) 219 according to the requirement.

The Al-cylindrical substrate 211 was rotated, and the resulting gas was discharged by suitably regulating the exhaust valve 212. A photosensitive layer 13 was formed in this manner.

Also an intermediate layer 12 of a thickness of 2000 Å was formed by introducing a mixed $H_2/B_2H_6$ (containing $B_2H_6$ gas in 0.2 vol. %) through the pipe 217-1.

REFERENCE EXAMPLE 1

An electrophotographic imaging member of a layer structure as shown in FIG. 1 was prepared utilizing gasses $CF_4$, $SiH_4$, $H_2$ and $B_2H_6$ in a film forming chamber, similar to the chamber 201, provided with a high-frequency device of 13.56 MHz.

Table 2A compares the preparing conditions and performances of the drum-shaped electrophotographic imaging members obtained in the Example 3 and in the Reference Example 1.

EXAMPLE 4

A PIN diode shown in FIG. 2 was prepared with an apparatus shown in FIG. 3.

At first a polyethylene terephthalate film 21, having an evaporated ITO film of 1000 Å, was placed on the support, and, after the pressure was reduced to $10^{-6}$ Torr, active species $SiF_2^*$ and $CF_2^*$, formed as in the Example 3, were introduced into the film forming chamber 101. Also $H_2$ gas and $PH_3$ gas (diluted to 1000 ppm with hydrogen gas) were respectively introduced and activated in the activation chamber (B) 123, and thus activated gasses were introduced into the film forming chamber 101 through the pipe 116. The pressure in the film forming chamber 101 was maintained at 0.1 Torr to obtain a P-doped n-type a-SiC (H,X) film 24 (thickness 700 Å).

Then the introduction of $PH_3$ gas was interrupted, and an undoped a-SiC(H,X) film 25 (5000 Å) was formed in the same manner as the n-type a-SiC(H,X) layer, except that the ratio of $SiF_2^*/CF_2^*$ was tripled.

Subsequently a B-doped p-type a-SiC(H,X) film 26 (700 Å) was formed in the same conditions as for the n-type film, except that $H_2/PH_3$ gas was replaced by $H_2$ gas combined with $B_2H_6$ gas (diluted to 1000 ppm with hydrogen gas). Then, on said p-type film, Al-electrodes 27 of a thickness of 1000 Å were formed by vacuum evaporation to obtain a PIN diode.

The diode element (area 1 cm$^2$) thus obtained was subjected to a measurement of I-V characteristic, for evaluating the rectifying and photovoltaic properties, as summarized in Table 3A.

Also in a light illumination through the substrate with an illumination intensity AMI of ca. 100 mW/cm$^2$, there were obtained a conversion efficiency of 7.8% or higher, an open circuit voltage of 0.92 V and a short circuit current of 10 mA/cm$^2$.

EXAMPLE 5

A PIN diode, similar to that in the Example 4, was prepared in the same manner as in the Example 4, except that in addition to the $H_2$ gas introduced from the pipe 110, $F_2$ gas was introduced (ratio $H_2/F_2=15$).

Table 3A indicates that the present invention can provide an amorphous semiconductor PIN diode with improved optical and electrical properties, compared with those of the conventional technology

EXAMPLE 6 a-SiC(H,X) films of i-, p- and n-types were prepared in the following manner with an apparatus shown in FIG. 3.

In FIG. 3, a desired substrate 101 is placed on a substrate support 102 in a film forming chamber 101.

A heater 104 is used for heating the substrate prior to film formation, or for annealing for improving the characteristics of the film after formation thereof, and is powered through wires 105. The temperature of the substrate is not particularly specified but is preferably in a range of 50° to 150° C., more preferably in a range of 100° to 150° C. in carrying out the process of the present invention.

Gas sources 106 to 109 are suitably provided according to the species of a gas of carbon-halogen containing compound and other gasses such as hydrogen, halogen, inert gas impurity containing compound etc. If said gasses are liquid in standard condition, suitable gasifiers are provided. In each of said gas supply system 106-109, there are provided a branched pipe 2, a flow meter b, a pressure gauge c for measuring the pressure of the high-pressure side of said flow meter, and flow rate regulating valves d, e. Around an activation chamber (B) 123 for generating an active species (B), there is provided a microwave plasma generator 122 for generating the activating energy for said active species formation. A raw material gas for active species formation, supplied from a gas pipe 110, is activated in the activation chamber 123, and the resulting active species (B) is introduced, through a pipe 124, into the film forming chamber 101. 111 indicates a gas pressure gauge.

There are further provided an activation chamber (A) 112, an electric furnace 113, solid carbon particles 114, and a pipe 115 for introducing a gaseous compound containing carbon and halogen, employed as a raw material for forming the active species (A). The active species (A) formed in the activation chamber (A) 112 is introduced into the film forming chamber 101 through a pipe 116.

There are further shown an exhaust valve 120 and an exhaust pipe 121.

At first a substrate 103, composed of a polyethylene terephthalate film, was placed on the support 102, and the film forming chamber 101 was evacuated to a pressure of $10^{-6}$ Torr with a vacuum pump. Then, at a substrate temperature shown in Table 1B, 150 sccm of $SiH_4$, or mixture thereof mixed with 40 sccm of $PH_3$ or $B_2H_6$ gas (each diluted to 1000 ppm with hydrogen gas), was introduced from the gas bomb 106, through a gas pipe 110, into the activation chamber (B) 123. The $SiH_4$ gas, $H_2$ gas etc. introduced into the activation chamber (B) 123 were activated by the microwave plasma generator 122 to form active hydrogen, $SiH_2^*$ etc., which were introduced into the film forming chamber 101 through a pipe 124.

On the other hand, the activation chamber (A) 102 was filled with solid carbon particles 114 and heated with the electric furnace 113 at ca. 1000° C. to maintain said carbon particles in a red heat state, and $CF_4$ was blown through a pipe 115 from a bomb (not shown) to form an active species (A) $CF_2^*$ which was introduced into the film forming chamber 101 through a pipe 116.

In this manner, the pressure in the film forming chamber 101 was maintained at 0.4 Torr to form a non-doped or doped A-SiC(H,X) film of a thickness of 700 Å, with a film forming speed of 24 Å/sec.

Then the specimen having a non-doped or p-type a-SiC(H,X) film thus formed was placed in an evaporation chamber for forming comb-shaped Al-gap electrodes (gas length 250 μm, width 5 mm) at a pressure of $10^{-5}$ Torr, and is then subjected to the measurement of dark current at 10 V, to determine the dark conductivity $\sigma_d$ for evaluating the characteristics of the layer. Table 1B summarizes the results obtained in various specimens.

EXAMPLES 7-9 a-SiC(H,X) film were prepared in the same manner as in the Example 6, except that $SiH_4$ was replaced by straight chain $Si_2H_6$, branched $Si_4H_{10}$ or $H_6Si_6F_6$. Table 1B summarizes the dark conductivities measured on various specimens.

Table 1B indicates that the present invention provides an A-SiC(H,X) film excellent in electrical properties, and also provided an a-SiC(H,X) film with sufficient doping.

EXAMPLE 10

An electrophotographic drum-shaped imaging member of a layer structure as shown in FIG. 1 was prepared in the following manner, with an apparatus shown in FIG. 4.

In FIG. 4, there are shown a film forming chamber 201; an activation chamber 202; an electric furnace 203; solid carbon particles 204; a pipe 205 for introducing a raw material for the active species (A); a pipe 206 for introducing the active species (A); a motor 207; a heater 208 employed in a similar manner as the heater 104 shown in FIG. 3; blow-off pipes 209, 210; a substrate 211 formed as an aluminum cylinder; an exhaust valve 212; gas sources 213-216 similar to those 106-109 shown in FIG. 3; and a gas supply pipe 217-1.

The cylindrical aluminum substrate 211 was suspended, with the heater 208 therein and in such a manner as to be rotatable with the motor 207, in the film forming chamber 201.

The activating chamber (A) 202 was filled with the solid carbon particles 204 and heated by the electric furnace 203 to maintain the carbon particles at a red heat state, and $CF_4$ was blown through a pipe 206 from bomb (not shown) to form an active species $CF_2^*$, which was introduced into the film forming chamber 201 through the pipe 206.

On the other hand, $Si_2H_6$ gas and $H_2$ gas were introduced through the pipe 217-1 into the film forming chamber 201. The introduced $Si_2H_6$ gas and $H_2$ gas were activated by a microwave plasma generator 220 in an activation chamber (B) 220 to generate active silicon hydride and active hydrogen, which were introduced into the film forming chamber 201 through a pipe 217-2. Simultaneously an impurity gas such as $PH_3$ or $B_2H_6$ was introduced into the activation chamber (B) 219 according to the requirement and activated therein.

The aluminum cylindrical substrate 211 was rotated, and the resulting gas was discharged by suitably regulating the exhaust valve 212. A photosensitive layer 13 was formed in this manner.

Also prior to the formation of the photosensitive layer 13, an intermediate layer 12 of a thickness of 2000 Å was prepared by introducing a mixed $H_2/B_2H_6$ gas (containing $B_2H_6$ in 0.2 vol. %) through the pipe 217, in addition to the gasses employed in the preparation of the photosensitive layer 13.

REFERENCE EXAMPLE 2

An electrophotographic imaging member of a layer structure as shown in FIG. 1 was prepared utilizing $CF_4$, $SiH_4$, $H_2$ and $B_2H_6$ in a film forming chamber, similar to the chamber 201, provided with a high-frequency device of 13.56 MHz, through ordinary plasma CVD.

Table 2B compares the preparing conditions and performances of the drum-shaped electrophotographic imaging members obtained in the Example 5 and in the Reference Example 2.

EXAMPLE 11

A PIN diode shown in FIG. 2 was prepared with an apparatus shown in FIG. 3, utilizing $Si_2H_6$ as the silicon compound.

At first a polyethylene terephthalate film 21, having an evaporated ITO film 22 of 1000 Å, was placed on the support, and, after the pressure was reduced to $10^{-6}$ Torr, an active species $CF_2^*$ was introduced into the film forming chamber 101, through the pipe 116, in the same manner as in the Example 1. Also 150 sccm of $Si_2H_6$ and $PH_3$ (diluted to 1000 ppm with hydrogen gas) were introduced, through the pipe 110, into the activation chamber (B) 123 and activated.

The gasses thus activated were introduced through the pipe 116 into the film forming chamber 101. The pressure in the film forming chamber 101 was maintained at 0.1 Torr to obtain a P-doped n-type A-SiC(H,X) film 24 (thickness 700 Å).

Then an i-type A-SiC(H,X) film 25 (thickness 7000 Å) was prepared in the same manner as for the n-type A-SiC(H,X) film, except that $B_2H_6$ gas (diluted to 300 ppm with hydrogen gas) was employed instead of $PH_3$ gas.

Subsequently a B-doped p-type carbon-containing A-SiC(H,X) film 6 (thickness 700 Å) was formed with same conditions as those for the n-type film, except that $B_2H_6$ (diluted to 1000 ppm with hydrogen gas) was employed in combination with $H_2$ gas. Then, on said p-type film, aluminum electrodes 27 of a thickness of 1000 Å were formed by vacuum evaporation to obtain a PIN diode.

The diode element (area 1 cm$^2$) thus obtained was subjected to a measurement of I-V characteristic, for evaluating the rectifying and photovoltaic properties, as summarized in Table 3B.

Also in a light illumination through the substrate with an illumination intensity AMI of ca. 100 mW/cm$^2$, there were obtained a conversion efficiency of 9.5% or higher, an open circuit voltage of 0.92 V and a short circuit current of 10.5 mA/cm$^2$.

EXAMPLES 12-14

PIN diodes similar to that in the Example 11, were prepared in the same manner as in the Example 11, except that $Si_2H_6$ was replaced by straight chain $Si_4H_{10}$, branched $Si_4H_{10}$ or $H_6Si_6F_6$ Table 3B summarized the rectifying and photovoltaic properties.

Results of Table 3B indicate that the present invention is capable of providing a PIN diode composed of A-SiC(H,X) film provided with improved optical electrical properties compared with the conventional ones.

EXAMPLE 15

A carbon-containing amrphous deposited film was prepared in the following manner with an apparatus shown in FIG. 3.

In FIG. 3, a desired substrate 103 is placed on a substrate support 102 in a film forming chamber 101.

A heater 104 is used for heating the substrate prior to film formation, or for annealing for improving the characteristics of the film after formation thereof, and is powered through wires 105. Said heater 104 is not activated during film formation. The temperature of the substrate is not particularly specified but is preferably in a range of 50° to 150° C., more preferably in a range of 100° to 150° C. in carrying out the process of the present invention.

Gas sources 106 to 109 are suitably provided according to the species of carbon compound gas and other gasses optionally employed, such as hydrogen, halogen compound, inert gas, impurity-containing compound etc. If said gasses are liquid in standard condition, suitable gasifiers are provided.

In each of said gas supplied systems 106–109, there are provided a branched pipe a, a flow meter b, a pressure gauge c for measuring the pressure of the high-pressure side of said flow meter, and flow rate regulating valves d, e. Around an activation chamber (B) 123 for forming an active species (B), there is provided a microwave plasma generator 122 for generating the activating energy for said active species formation. A raw material gas for active species formation, supplied from a gas pipe 110, is activated in the activating chamber 123, and the resulting active species (B) is introduced, through a pipe 124, into the film forming chamber 101. 111 indicates a gas pressure gauge.

There are further provided an activation chamber (A) 112, an electric furnace 113, solid carbon particles 114, and a pipe 115 for introducing a gaseous compound containing carbon and halogen, employed as a raw material for forming the active species (A). The active species (A) formed in the activation chamber (A) 112 is introduced into the film forming chamber 101 through a pipe 116.

There are further shown an exhaust valve 120 and an exhaust pipe 121.

At first a substrate 103, composed of a polyethylene terephthalate film was placed on the support 102, and the film forming chamber 101 was evacuated to a pressure of $10^{-6}$ Torr with a vacuum pump. 150 sccm of $CH_4$ was introduced from the gas bomb 106, through a gas pipe 110, into the activation chamber (B) 123. The $CH_4$ gas introduced into the activation chamber (B) 123 was activated by the microwave plasma generator 122 to generate active hydrocarbon and active hydrogen, which were introduced into the film forming chamber 101 through a pipe 124.

On the other hand, the activation chamber (A) 102 was filled with solid carbon particles 114 and heated with the electric furnace 113 at ca. 1000° C. to maintain said carbon particles at a red heat state, and $CF_4$ was blown through a pipe 155 from a bomb (not shown) to generate an active species $CF_2^*$ which was introduced into the film forming chamber 101 through a pipe 116.

In this manner, the pressure in the film forming chamber 101 was maintained at 0.3 Torr to form an amorphous carbon-containing film A-C(H,X) of a thickness 700 Å, with a film forming speed of 9.0 Å/sec.

Then the specimen having the A-C(H,X) film thus formed was placed in an evaporation chamber for forming comb-shaped aluminum gap electrodes (gap length 250 μm, width 5 mm) at a pressure of $10^{-5}$ Torr, and is then subjected to the measurement of a dark current at an applied voltage of 10 V, to determine the dark conductivity $\sigma_d$. Table 1C summarizes the layer characteristics of the specimens evaluated from said dark conductivity.

EXAMPLES 16-18

Amorphous carbon-containing film A-C(H,X) were prepared in the same manner as in the example 15, except that $CH_4$ was replaced by straight chain $C_2H_6$, $C_2H_4$ or $C_2H_2$. Table 1C summarizes the results of measurement of dark conductivity.

The results shown in Table 1C indicate that the present invention allows to obtain a carbon-containing amorphous film with excellent electrical properties and a carbon-containing amorphous film with sufficient doping.

EXAMPLE 19

An electrophotographic drum-shaped imaging member of a layer structure as shown in FIG. 1 was prepared in the following manner, with an apparatus shown in FIG. 4.

In FIG. 4, there are shown a film forming chamber 201; an activation chamber (A) 202; an electric furnace 203; solid carbon particles 204; a pipe 205 for introducing a raw material for the active species (A); a pipe 206 for introducing the active species (A); a motor 207; a heater 208 employed in a similar manner as the heater 104 shown in FIG. 3; blow-off pipes 209, 210; a substrate 211 formed as an aluminum cylinder; an exhaust valve 212; gas sources 213–216 similar to those 106–109 shown in FIG. 3; and a gas supply pipe 217-1.

The cylindrical aluminum substrate 211 was suspended, with the heater 208 therein and in such a manner as to be rotatable with the motor 207, in the film forming chamber 201.

The activation chamber (A) 202 was filled with the solid carbon particles 204 and heated by the electric furnace 203 to ca. 1000° C. to maintain the carbon particles at a red heat state, and $CF_4$ was blown through a pipe 206 from an unrepresented bomb to form $CF_2^*$ as the active species (A), which was introduced into the film forming chamber 201 through the pipe 206.

On the other hand, $CH_4$, $Si_2H_6$ and $H_2$ gasses were introduced through the pipe 217-1 into the activation chamber (B) 219 and activated therein by a microwave plasma generator 219 to generate active hydrocarbons, active silicon hydrides and active hydrogen which were introduced into the film forming chamber 201 through a pipe 217-2. Simultaneously an impurity gas such as $PH_3$ or $B_2H_6$ was introduced into the activation chamber (B) 219 according to the requirement and activated therein.

The cylindrical aluminum substrate 211 was rotated, and the used gas was discharged by suitably regulating the exhaust valve 212. A photosensitive layer 13 was formed in this manner.

Also an intermediate layer 12 of a thickness of 2000 Å was prepared by introducing a mixed $H_2/B_2H_6$ gas (containing $B_2H_6$ in 0.2 vol. %) through the pipe 217-2, in addition to the gasses employed in the preparation of the photosensitive layer 13.

REFERENCE EXAMPLE 3

An electrophotographic imaging member of a layer structure as shown in FIG. 1 was prepared utilizing $CF_4$, $CH_4$, $Si_2H_6$, $H_2$ and $B_2H_6$ in a film forming chamber, similar to the chamber 201, provided with a high-frequency device of 13.56 MHz, through an ordinary plasma CVD process.

Table 2C compares the preparing conditions and performances of the drum-shaped electrophotographic imaging members obtained in the Example 19 and in the Reference Example 3.

EXAMPLE 20

A PIN diode shown in FIG. 2 was prepared with an apparatus shown in FIG. 3, utilizing $CH_4$ as the carbon-containing compound.

At first a polyethylene terephthalate film 21, having an evaporated ITO film of 1000 Å, was placed on the support, and, after the pressure was reduced to $10^{-6}$ Torr, active species $CF_2^*$ and $SiF_2^*$ were introduced into the film forming chamber 101, through the pipe 116, in the same manner as in the Example 1. Also $Si_2H_6$ gas and $PH_3$ gas (diluted to 1000 ppm with hydrogen gas) were introduced and activated in the activation chamber (B) 123. Then the gasses thus activated were introduced through the pipe 116 into the film forming chamber 101. The pressure in the film forming chamber 101 was maintained at 0.1 Torr to obtain a P-doped n-type a-SiC(H,X) film 24 (thickness 700 Å).

Then the introduction of $PH_3$ gas was interrupted, and a non-doped a-SiC(H,X) film 25 (thickness 5000 Å) was prepared in the same manner as the n-type A-SiC(H,X) film, except that the ratio of $SiF_2^*/CF_2^*$ was tripled.

Subsequently a B-doped p-type A-SiC(H,X) film 26 (thickness 700 Å) was formed in the same manner as the n-type layer, except that $CH_4$ and $B_2H_6$ (diluted to 1000 ppm with hydrogen gas) were employed together with $Si_2H_6$. Then, on said p-type film, aluminum electrodes 27 of a thickness of 1000 Å were formed by vacuum evaporation to obtain a PIN diode.

The diode element (area 1 $cm^2$) thus obtained was subjected to a measurement of I-V characteristic, for evaluating the rectifying and photovoltaic properties, as summarized in Table 3C.

Also in a light illumination through the substrate with an illumination intensity AMI of ca. 100 mW/$cm^2$, there were obtained a conversion efficiency of 7.6% or higher, an open circuit voltage of 0.95 V and a short circuit current of 10.2 mA/$cm^2$.

EXAMPLES 21-23

PIN diodes, similar to that in the Example 20, were prepared in the same manner as in the Example 20, except that a carbon compound $C_2H_6$, $C_2H_4$, or $C_2H_2$ was employed instead of $CH_4$. Table 3C summarizes the rectifying and photovoltaic properties.

Results of Table 3C indicate that the present invention allows to obtain an amorphous semiconductor PIN diode of improved optical and electrical properties in comparison with those obtainable with the conventional technology.

EXAMPLE 24

Amorphous germanium deposited film of i-, p-and n-types were prepared in the following manner with an apparatus shown in FIG. 3.

In FIG. 3 a desired substrate 103 is placed on a substrate support 102 in a film forming chamber 101.

A heater 104 is used for heating the substrate prior to layer formation, or for annealing for improving the characteristics of the layer after formation thereof, and is powered through wires 105. Said heater 104 is not activated during film formation. The temperature of the substrate is not particularly specified but is preferably in a range of 50° to 150° C., more preferably in a range of 100° to 150° C. in carrying out the process of the present invention.

Gas sources 106 to 109 are suitably provided according to the species of a gas of germanium compound, and optionally employed other gasses for example hydrogen, halogen compound, inert gas, silicon compound, carbon compound, impurity-containing compound etc. If said gasses are liquid in standard condition, suitable gasifiers are provided.

In each of said gas supply systems 106–109, there are provided a branched pipe a, a flow meter b, a pressure gauge c for measuring the pressure of the high-pressure side of said flow meter, and flow rate regulating valves d, e. Around an activation chamber (B) 123 for forming an active species (B), there is provided a microwave plasma generator 122 for generating the activating energy for said active species formation. A raw material gas for active species formation, supplied from a gas pipe 110, is activated in the activation chamber 123, and the resulting active species (B) is introduced, through a pipe 124, into the film forming chamber 101. 111 indicates a gas pressure gauge.

There are further provided an activation chamber (A) 112, an electric furnace 113, solid carbon particles 114, and a pipe 115 for introducing a gaseous compound containing carbon and halogen, employed as a raw material for forming the active species (A). the active species (A) formed in the activation chamber (A) 112 is introduced into the film forming chamber 101 through a pipe 116.

There are further shown an exhaust valve 120 and an exhaust pipe 121.

At first a substrate 103, composed of a polyethylene terephthalate film, was placed on the support 102, and the film forming chamber 101 was evacuated to a pressure of $10^{-6}$ Torr with a vacuum pump. 150 sccm of GeH$_4$ gas, optionally mixed with 40 sccm of PH$_3$ or B$_2$H$_6$ gas (each diluted to 1000 ppm with hydrogen gas), was introduced from the gas bomb 106, through a gas pipe 110 into an activation chamber (B) 123. The GeH$_4$ gas etc. introduced into the activation chamber (B) 123 were activated by the microwave plasma generator 122 to generate active germanium hydride and active hydrogen, which were introduced into the film forming chamber 101 through a pipe 124.

On the other hand, the activation chamber (A) 102 was filled with solid carbon particles 114 and heated with the electric furnace 113 at ca. 1000° C. to maintain said carbon particles at a red heat state, and CF$_4$ was blown through a pipe 155 from a bomb (not shown) to form an active species CF$_2$* which was introduced into the film forming chamber 101 through a pipe 116.

In this manner, the pressure in the film forming chamber 101 was maintained at 0.3 Torr to form a non-doped or doped A-Ge(C, H, X) film (thickness 700 Å) with a film forming speed of 10 Å/sec.

Then the specimen having the A-Ge(C, H, X) film thus formed was placed in an evaporation chamber for forming comb-shaped aluminum gap electrodes (gap length 250 μm, width 5 mm) at a pressure of $10^{-5}$ Torr, and is then subjected to the measurement of a dark current at an applied voltage of 10 V, to determine the dark conductivity $\sigma_d$. Table 1D summarizes the layer characteristics of the specimens evaluated from said dark conductivity.

EXAMPLES 25-27

A-Ge(C, H, X) layers were prepared in the same manner as in the Example 24, except that GeH$_4$ was replaced by straight chain Ge$_4$H$_{10}$, branched Ge$_4$H$_{10}$ or H$_6$Ge$_6$F$_6$. Table 1D summarizes the results of measurement of dark conductivity.

Results shown in Table 1D indicate that the present invention allows to obtain an A-Ge(C, H, X) film of excellent electrical properties, and an A-Ge (C, H, X) film with sufficient doping.

EXAMPLE 28

An electrophotographic drum-shaped imaging member of a layer structure as shown in FIG. 1 was prepared in the following manner, with an apparatus shown in FIG. 4.

In FIG. 4, there are shown a film forming chamber 201; an activation chamber (A) 202; an electric furnace 203; solid carbon particles 204; a pipe 205 for introducing a raw material for forming the active species (A); a pipe 206 for introducing the active species (A); a motor 207; a heater 208 employed in a similar manner as the heater 104 shown in FIG. 3; blow-off pipes 209, 210; a substrate 211 formed as an aluminum cylinder; an exhaust valve 212; gas sources 213-216 similar to those 106-109 shown in FIG. 3; and a gas supply pipe 217-1.

The cylindrical aluminum substrate 211 was suspended, with the heater 208 therein and in such a manner as to be rotatable with the motor 207, in the film forming chamber 201.

The activating chamber (A) 202 was filled with the solid carbon particles 204 and heated by the electric furnace 203 to ca. 1000° C. to maintain the carbon particles at a red heat state, and CF$_4$ was blown through a pipe 206 from a bomb (not shown) to generate CF$_2$* as the active species (A), which was introduced into the film forming chamber 201 through the pipe 206.

On the other hand, Si$_2$H$_6$, GeH$_4$ and H$_2$ gasses were introduced through the pipe 217-1 into the activation chamber (B) 219 and activated therein by a microwave plasma generator 220 to generate active silicon hydride, active germanium hydride and active hydrogen, which were introduced into the film forming chamber 201 through a pipe 217-2. Simultaneously an impurity gas such as PH$_3$ or B$_2$H$_6$ was introduced into the activation chamber (B) 219 according to the requirement and activated therein.

The cylindrical aluminum substarte 211 was rotated, and the use gas was discharged by suitably regulating the exhaust valve 212. A photosensitive film 13 was formed in this manner.

Prior to the formation of the photosensitive layer 13, an intermediate layer 12 of a thickness of 2000 Å was prepared by introducing a gaseous mixture of Si$_2$H$_6$, GeH$_4$, H$_2$ and B$_2$H$_6$ (containing B$_2$H$_6$ in 0.2 vol. %) through the pipe 217-1.

REFERENCE EXAMPLE 4

An electrophotographic imaging member of a layer structure as shown in FIG. 1 was prepared utilizing CF$_4$, Si$_2$H$_6$, GeH$_4$, H$_2$ and B$_2$H$_6$ in a film forming chamber, similar to the chamber 201, provided with a high-frequency device of 13.56 MHz through an ordinary plasma CVD process.

Table 2D compares the preparing conditions and performances of the drum-shaped electrophotographic imaging members obtained in the Example 28 and in the Reference Example 4.

EXAMPLE 29

A PIN diode shown in FIG. 2 was prepared with an apparatus shown in FIG. 3, utilizing GeH$_4$ as the germanium containing compound.

At first a polyethylene terephthalate film 21, having an evaporated ITO film of 1000 Å, was placed on the support, and, after the pressure was reduced to $10^{-6}$ Torr, active species CF$_2$* and SiF$_2$* were introduced into the film forming chamber 101, through the pipe 116, in the same manner as in the Example 24. Also 50 sccm of GeH$_4$, Si$_3$H$_6$ and PH$_3$ gas (diluted to 1000 ppm with hydrogen gas) were introduced and activated in the activation chamber (B) 123.

Then the gasses thus activated were introduced through the pipe 116 into the film forming chamber 101. The pressure in the film forming chamber 101 was maintained at 0.4 Torr to obtain a P-doped n-type A-SiGeC (H, X) film 24 of a thickness of 700 Å.

Then a non-doped A-SiGe(H, X) film 25 (thickness 5000 Å) was prepared in the same method as in the case of n-type A-SiGeC(H, X) except that PH$_3$ gas was replaced by B$_2$H$_6$ gas (diluted to 300 ppm with hydrogen gas) and that the ratio SiF$_2$*/CF$_2$* was tripled.

Subsequently a B-doped p-type A-SiGeC(H, X) 26 (thickness 700 Å) was formed in the same manner as the n-type film, except the use of B$_2$H$_6$ gas (diluted to 1000 ppm with hydrogen gas). Then, on said p-type layer, aluminum electrodes 27 of a thickness of 1000 Å were formed by vacuum evaporation to obtain a PIN diode.

The diode element (area 1 cm$^2$) thus obtained was subjected to a measurement of I-V characteristic, for evaluating the rectifying and photovoltaic properties, as summarized in Table 3D.

Also in a light illumination through the substrate with an illumination intensity AMI of ca. 100 mW/cm², there were obtained a conversion efficiency of 6.9% or higher, an open circuit voltage of 0.92 V and a short circuit current of 10.8 mA/cm².

EXAMPLES 30–32

PIN diodes, similar to that in the Example 29, were prepared in the same manner as in the Example 29, except that straight chain $Ge_4H_{10}$, branched $Ge_4H_{10}$ or $H_6Ge_6F_6$ was employed as the germanium compound instead of $Ge_4H_{10}$. Table 3D summarizes the rectifying and photovoltaic properties.

Results in Table 3D indicate that the present invention allows to obtain an A-SiGeC(H, X) PIN diode of improved optical and electrical properties in comparison with those obtainable with the conventional technology.

EXAMPLE 33

An amorphous deposited film was prepared in the following manner with an apparatus shown in FIG. 3.

In FIG. 3, a desired substrate 103 is placed on a substrate support 102 in a film forming chamber 101.

A heater 104 is used for heating the substrate prior to layer formation, or for annealing for improving the characteristics of the layer after formation thereof, and is powered through wires 105. The temperature of the substrate is not particularly specified, but is preferably in a range of 50° to 150° C., more preferably in a range of 100° to 150° C. in carrying out the process of the present invention.

Gas sources 106 to 109 are suitably provided according to the species of a gas employed as a raw material for film formation, and other gasses optionally employed, such as inert gas or a gas for impurity-containing compound. If said gasses are liquid in normal condition, suitable gasifiers are provided.

In each of said gas supply systems 106–109, there are provided a branched pipe a, a flow meter b, a pressure gauge c for measuring the pressure of the high-pressure side of said flow meter, and flow rate regulating valves d, e. Around an activating chamber (B) 123 for generating an active species (B), there is provided a microwave plasma generator 122 for generating the activating energy for said active species formation. A raw material gas for active species formation, supplied from a gas pipe 110, is activated in the activation chamber 123, and the resulting active species (B) is introduced, through a pipe 124, into the film forming chamber 101. 111 indicates a gas pressure gauge.

There are further provided an activation chamber (A) 122, an electric furnace 113, solid carbon particles 114, and a pipe 115 for introducing a gaseous compound containing carbon and halogen, employed as a raw material for forming the active species (A). The active species (A) generated in the activation chamber (A) 112 is introduced into the film forming chamber 101 through a pipe 116.

There are further shown an exhaust valve 120 and an exhaust pipe 121.

At first a substrate 103, composed of a polyethylene terephthalate film, was placed on the support 102, and the deposition chamber 101 was evacuated to a pressure of $10^{-6}$ Torr with a vacuum pump. Disiloxane in gasified form was introduced, from the gas bomb 106 and through a gas pipe 110, into an activation chamber (B) 123, and activated therein by a microwave plasma generator 122 to generate active disiloxane, which was introduced into the film forming chamber 101 through a pipe 124.

On the other hand, the activation chamber (A) 102 was filled with solid carbon particles 114 and heated with the electric furnace 113 at ca. 1000° C. to maintain said carbon particles at a red heat state, and $CF_4$ was blown through a pipe 155 from a bomb (not shown) to form an active species $CF_2^*$ which was introduced into the film forming chamber 101 through a pipe 116.

In this manner, the pressure in the film forming chamber 101 was maintained at 0.3 Torr to form an A-SiOC(H, X) film of a thickness of 700 Å, with a deposition speed of 10 Å/sec.

Then the specimen having the A-SiOC(H, X) film thus formed was placed in an evaporation chamber for forming comb-shaped aluminum gap electrodes (gap length 250 μm, width 5 mm) at a pressure of $10^{-5}$ Torr, and is then subjected to the measurement of a dark current at an applied voltage of 15 V, to determine the dark conductivity $\sigma_d$. Table 1E summarizes the layer characteristics of the specimens evaluated from said dark conductivity.

EXAMPLE 34

An A-SiOC(H, X) film was prepared in the same process and procedure as in the Example 33, except that $H_3SiOSiH_3/H_2/F_2$ gas (gas volume ratio $H_3SiOSiH_3/H_2/F_2 = 10:10:3$) was introduced from the container 106 etc. Table 1E summarizes the results of measurement of dark conductivity.

Results shown in Table 1E indicate that the present invention allows to obtain an amorphous layer with excellent electrical properties.

EXAMPLE 35

An electrophotographic drum-shaped imaging member of a layer structure as shown in FIG. 1 was prepared in the following manner, with an apparatus shown in FIG. 4.

In FIG. 4, there are shown a film forming chamber 201; an activation chamber (A) 202; an electric furnace 203; solid carbon particles 204; a pipe 205 for introducing a raw material for forming the active species (A); a pipe 206 for introducing the active species (A); a motor 207; a heater 208 employed in a similar manner as the heater 104 shown in FIG. 3; blow-off pipes 209, 210; a substrate 211 formed as an aluminum cylinder; an exhaust valve 212; gas sources 213–216 similar to those 106–109 shown in FIG. 3; and a gas supply pipe 217-1.

The cylindrical aluminum substrate 211 was suspended, with the heater 208 therein and in such a manner as to be rotatable by the motor 207, in the film forming chamber 201.

The activation chamber (A) 202 was filled with the solid carbon particles 204 and heated by the electric furnace 203 to ca. 1000° C. to maintain the carbon particles at a red heat state, and $CF_4$ was blown through a pipe 206 from a bomb (not shown) to form $CF_2^*$ as the active species (A), which was introduced into the film forming chamber 201 through the pipe 206. Also an active species (C) $SiF_2^*$, prepared similarly from solid silicon particles and $SiF_4$, was introduced from an activating chamber (C) (not shown) of a structure similar to that of the activating chamber (A) 202.

On the other hand, gasified disiloxane was introduced, through the pipe 217-1, into the activation chamber (B) 219 and activated therein by a microwave plasma generator 220 to form active disiloxane, which was introduced into the film forming chamber 201 through a pipe 217-2. Simultaneously an impurity gas such as $PH_3$ or $B_2H_6$ was introduced into the activation chamber (B) 219 according to the requirement and activated therein.

The cylindrical aluminum substrate 211 was rotated, and the used gas was discharged by suitably regulating the exhaust valve 212. An intermediate layer 12 was formed in this manner with a thickness of 2000 Å.

Then a photosensitive layer 13 was formed in the same manner as the intermediate layer 12, except that, among the gasses employed in the preparation of said intermediate layer 12, $CF_4$ was eliminated and disiloxane was replaced by $H_2$, and a gaseous mixture of $H_2/B_2H_6$ (containing $B_2H_6$ gas in 0.2 vol. %) was additionally introduced through the pipe 217-1.

REFERENCE EXAMPLE 5

An electrophotographic imaging member of a layer structure as shown in FIG. 1 was prepared utilizing $CF_4$, $SiH_4$, disiloxane, $H_2$ and $B_2H_6$ in a film forming chamber, similar to the chamber 201, provided with a high-frequency device of 13.56 MHz.

Table 2E compares the preparing conditions and performances of the drum-shaped electrophotographic imaging members obtained in the Example 35 and in the Reference Example 5.

EXAMPLE 36

A PIN diode shown in FIG. 2 was prepared with an apparatus shown in FIG. 3.

At first a polyethylene terephthalate film 21, having an evaporated ITO film of 1000 Å, was placed on the support, and, after the pressure was reduced to $10^{-6}$ Torr, an active species $SiF_2^*$ formed as in the Example 35 was introduced into the film forming chamber 101. Also $H_2$ gas and $PH_3$ gas (diluted to 1000 ppm with hydrogen gas) were introduced and activated in the activation chamber (B) 123, and the gasses thus activated were introduced through the pipe 116 into the film forming chamber 101. The pressure in the film forming chamber 101 was maintained at 0.1 Torr to obtain a P-doped n-type A-Si(H, X) film 24 of a thickness of 700 Å.

Then the introduction of $PH_3$ was interrupted, and a non-doped A-Si(H, X) film 25 (thickness 5000 Å) was prepared in the same manner as the n-type A-Si (H, X) film except that $SiF_2^*$ and $CF_2^*$ were employed.

Subsequently a B-doped p-type A-SiO(H, X) film 26 (thickness 700 Å) was prepared under the same conditions as those for the preparation of n-type film, except that $H_2/PH_3$ were replaced by a mixture of $H_3$—$SiOSiH_3/H_2$ (mixing ratio 1:10) combined with $B_2H_6$ gas (diluted to 1000 ppm with hydrogen gas). Then, on said p-type film, aluminum electrodes 27 of a thickness of 1000 Å were formed by vacuum evaporation to obtain a PIN diode.

The diode element (area 1 cm²) thus obtained was subjected to a measurement of I-V characteristics, for evaluating the rectifying and photovoltaic properties, as summarized in Table 3E.

Also in a light illumination through the substrate with an illumination intensity AMI of ca. 100 mW/cm², there were obtained a conversion efficiency of 8.0% or higher, an open circuit voltage of 0.95 V and a short circuit current of 12 mA/cm².

EXAMPLE 37

A PIN diode, similar to that in the Example 36, was prepared in the same manner as in the Example 36, except that in addition to $H_3SiOSiH_3/H_2$ gas, $F_2$ gas (gas volume ratio $H_3SiOSiH_3:H_2:F_2 = 1:15:2$) was introduced from the pipe 110. Table 3E summarizes the rectifying and photovoltaic properties.

EXAMPLE 38

An amorphous deposited layer was prepared in the following manner with an apparatus shown in FIG. 3.

In FIG. 3, a desired substrate 103 is placed on a substrate support 102 in a film forming chamber 101.

A heater 104 is used for heating the substrate prior to film formation, or for annealing for improving the characteristics of the film after formation thereof, and is powered through wires 105. The temperature of the substrate is not particularly specified, but is preferably in a range of 30° to 450° C., more preferably in a range of 100° to 250° C. in carrying out the process of the present invention.

Gas sources 106 to 109 are suitably provided according to the species of a gas employed as a raw material for film formation, and other gasses optionally employed such as inert gas or a gas of impurity-containing compound. If said gasses are liquid in standard condition, suitable gasifiers are provided.

In each of said gas supply systems 106–109, there are provided a branched pipe a, a flow meter b, a pressure gauge c for measuring the pressure of the high-pressure side of said flow meter, and flow rate regulating valves d, e. Around an activation chamber (B) 123 for forming an active species (B), there is provided a microwave plasma generator 122 for generating the activating energy for said active species formation. A raw material gas for active species formation, supplied from a gas pipe 110, is activated in the activation chamber 123, and the resulting active species (B) is introduced, through a pipe 124, into the film forming chamber 101. 111 indicates a gas pressure gauge.

There are further provided an activation chamber (A) 122, an electric furnace 113, solid carbon particles 114, and a pipe 115 for introducing a gaseous compound containing carbon and halogen, employed as a raw material for forming the active species (A). The active species (A) formed in the activation chamber (A) 112 is introduced into the film forming chamber 101 through a pipe 116.

There are further shown an exhaust valve 120 and an exhaust pipe 121.

At first a substrate 103, composed of a polyethylene terephthalate film, was placed on the support 102, and the film forming chamber 101 was evacuated to a pressure of $10^{-6}$ Torr with a vacuum pump. Triethylsilazane in gasified form was introduced, from the gas bomb 106 and through a gas pipe 110, into an activation chamber (B) 123, and activated therein by a microwave plasma generator 122 to form active triethylsilazane, which was introduced into the film forming chamber 101 through a pipe 124.

On the other hand, the activation chamber (A) 102 was filled with solid carbon particles 114 and heated with the electric furnace 113 at ca. 1000° C. to maintain said carbon particles at a red heat state, and $CF_4$ was blown through a pipe 155 from a bomb (not shown) to form an active species $CF_2^*$ which was introduced into the film forming chamber 101 through a pipe 116.

In this manner, the pressure in the film forming chamber 101 was maintained at 0.3 Torr to form an A-SiNC(H, X) film of a thickness of 700 Å, with a film forming speed of 11 Å/sec Then the specimen having the A-SiNC(H, X) film thus formed was placed in an evaporation chamber for forming comb-shaped aluminum gap electrodes (gap length 250 μm, width 5 mm) at a pressure of $10^{-5}$ Torr, and is then subjected to the measurement of a dark current at an applied voltage of 12 V, to determine the dark conductivity $\sigma_d$. Table 1F summarizes the layer characteristics of the specimens evaluated from said dark conductivity.

EXAMPLE 39

An A-SiNC(H, X) was prepared in the same manner as in the Example 38, except that $(C_2H_5)_3SiNH_2/H_2/F_2$ gas (gas volume ratio $(C_2H_5)_3SiNH_2:H_2:F_2=8:8:1$) was introduced from the bomb 106. Table 1F summarizes the results of measurement of dark conductivity.

Results shown in Table 1F indicate that the present invention allows to obtain an amorphous film with excellent electrical properties.

EXAMPLE 40

An electrophotographic drum-shaped imaging member of a layer structure as shown in FIG. 1 was prepared in the following manner, with an apparatus shown in FIG. 4.

In FIG. 4 there are shown a film forming chamber 201; an activation chamber (A) 202; an electric furnace 203; solid carbon particles 204; a pipe 205 for introducing a raw material for forming the active species (A); a pipe 206 for introducing the active species (A); a motor 207; a heater 208 employed in a similar manner as the heater 104 shown in FIG. 3; blow pipes 209, 210; a substrate 211 formed as an aluminum cylinder; an exhaust valve 212; gas sources 213–216 similar to those 106–109 shown in FIG. 3; and a gas supply pipe 217-1.

The cylindrical aluminum substrate 211 was suspended, with the heater 208 therein and in such a manner as to be rotatable by the motor 207, in the film forming chamber 201.

The activation chamber (A) 202 was filled with the solid carbon particles 204 and heated by the electric furnace 203 to ca. 1000° C. to maintain the carbon particles at a red heat state, and CF$_4$ was blown through a pipe 206 from a bomb (not shown) to form CF$_2$* as the active species (A), which was introduced into the film forming chamber 201 through the pipe 206. Also an active species (C) SiF$_2$*, prepared similarly from solid silicon particles and SiF$_4$, was introduced from an activation chamber (C) (not shown) of a structure similar to that of the activation chamber (A) 202.

On the other hand, gasified triethyldisilazane was introduced, through the pipe 217-1, into the activation chamber (B) 219 and activated therein by a microwave plasma generator 220 to form active triethyldisilazene, which was introduced into the film forming chamber 201 through a pipe 217-2. Simultaneously an impurity gas such as PH$_3$ or B$_2$H$_6$ was introduced into the activation chamber (B) 219 according to the requirement and activated therein.

The cylindrical aluminum substrate 211 was rotated, and the use gas was discharged by suitably regulating the exhaust valve 212. An intermediate layer 12 was formed in this manner with a thickness of 2000 Å.

Then a photosensitive layer 13 was formed in the same manner as the intermediate layer 12, except that, among the gasses employed in the preparation of said intermediate layer 12, CF$_4$ was eliminated and triethylsilazane was replaced by H$_2$, and a gaseous mixture of H$_2$/B$_2$H$_6$ (containing B$_2$H$_6$ in 0.2 vol. %) was additionally introduced through the pipe 217-1.

REFERENCE EXAMPLE 6

An electrophotographic imaging member of a layer structure as shown in FIG. 1 was prepared utilizing CF$_4$, SiH$_4$, triethyldisilazane, H$_2$ and B$_2$H$_6$ in a film forming chamber, similar to the chamber 201, provided with a high-frequency device of 13.56 MHz.

Table 2F compares the preparing conditions and performances of the drum-shaped electrophotographic imaging members obtained in the Example 40 and in the Reference Example 6.

EXAMPLE 41

A PIN diode shown in FIG. 2 was prepared with an apparatus shown in FIG. 3.

At first a polyethylene terephthalate film 21, having an evaporated ITO film of 1000 Å, was placed on the support, and, after the pressure was reduced to $10^{-6}$ Torr, an active species SiF$_2$* formed as in the Example 40 was introduced into the film forming chamber 101. Also H$_2$ and PH$_3$ gas (diluted to 1000 ppm with hydrogen gas) were introduced and activated in the activation chamber (B) 123, and the gasses thus activated were introduced through the pipe 116 into the film forming chamber 101. The pressure in the film forming chamber 101 was maintained at 0.1 Torr to obtain a P-doped n-type A-Si(H, X) film 24 of a thickness of 700 Å.

Then the introduction of pH$_3$ was interrupted, and a non-doped A-Si(H. X) film 25 (thickness 5000 Å) was formed in the same manner as the n-type A-Si (H, X) layer except for the ratio SiF$_2$*/CF$_2$*.

Then a B-doped p-type A-SiNC(H, X) film 26 of a thickness of 700 Å was formed in the same manner as in the preparation of the n-type film, except that H$_2$/PH$_3$ gaseous mixture was replaced by $(C_2H_5)_3Si$-NH$_2$/H$_2$ (mixing ratio 1:10) combined with B$_2$H$_6$ (diluted to 1000 ppm with hydrogen gas). Then, on said p-type film, aluminum electrodes 27 of a thickness of 1000 Å were formed by vacuum evaporation to obtain a PIN diode.

The diode element (area 1 cm$^2$) thus obtained was subjected to a measurement of I-V characteristic, for evaluating the rectifying and photovoltaic properties, as summarized in Table 3.

Also in a light illumination through the substrate with an illumination intensity AMI of ca 100 mW/cm$^2$, there were obtained a conversion efficiency of 8.0% or higher, an open circuit voltage of 0.92 V and a short circuit current of 10 mA/cm$^2$.

EXAMPLE 42

A PIN diode, similar to that in the Example 41, was prepared in the same manner as in the Example 41, except that in addition to $(C_2H_5)_3SiNH_2/H_2$ gas, F$_2$ gas (mixing ratio $(C_2H_5)_3SiNH_2/H_2/F_2=1:15:2$) was introduced from the pipe 110. Table 3F summarizes the rectifying and photovoltaic properties.

TABLE 1A

|  | Example 1 | Example 2 |
|---|---|---|
| Gas for forming active species (B) | H$_2$ | H$_2$/F$_2$ |

TABLE 1A-continued

|  | Example 1 | Example 2 |
|---|---|---|
| $\delta d$ (non-doped) $(\Omega \cdot cm)^{-1}$ | $7.9 \times 10^{-10}$ | $8.0 \times 10^{-10}$ |
| $\delta d$ (B-doped) $(\Omega \cdot cm)^{-1}$ | $2.8 \times 10^{-9}$ | $7.1 \times 10^{-9}$ |
| $\delta e$ (P-doped) $(\Omega \cdot cm)^{-1}$ | $3.0 \times 10^{-8}$ | $4.0 \times 10^{-8}$ |

TABLE 2A

|  | Example 3 | Reference Example 1 |
|---|---|---|
| Gas for forming active species (A) | $CF_4/SiF_4$ | |
| Activating temperature | 1000° C. | |
| Main active species | $CF_2*$ $SiF_2*$ | |
| Gas for forming active species (B) | $H_2$ | |
| Amount from activation chamber (A) | 200 SCCM | |
| Amount from activation chamber (B) | 100 SCCM | |
| Amount from gas bomb | | $CF_4$ 50 SCCM $SiF_4$ 100 SCCM $SiH_4$ 100 SCCM $H_2$ 100 SCCM |
| Pressure in film forming chamber | 0.9 Torr | 1.0 Torr |
| Film forming speed | 10Å/sec | 5Å/sec |
| RF discharge power | | 1.8 w/cm² |
| Photosensitive layer 13 thickness | 22μ | 22μ |
| Average number of image defects in 10 pcs. of drum-shaped electrophotographic imaging member | 5 | 15 |
| Acceptance potential fluctuation in circumferential direction | ±10 V | ±30 V |
| Acceptance potential fluctuation in axial direction | ±15 V | ±35 V |
| Note | Example of this invention | Example by usual plasma CVD Substrate temperature: 250° C. |

TABLE 3A

|  | Example 4 | Example 5 |
|---|---|---|
| Gas for film formation | $H_2$ | $H_2/F_2$ |
| Rectifying ratio of diode (*1) | $4 \times 10^2$ | $3 \times 10^2$ |
| n value of diode (*2) | 1.1 | 1.0 |

*1 ratio of forward current to inverse current at 1 V
*2 n value (quality factor) in a current equation $$J = J_s \left\{ \exp\left(\frac{eV}{nRT}\right) - 1 \right\} \text{ for a p - n junction}$$

TABLE 1B

|  | Example 6 | Example 7 | Example 8 | Example 9 |
|---|---|---|---|---|
| Si containing compound for forming active species (B) | $SiH_4$ | $Si_2H_6$ | $SiH_3SiH-(SiH_3)SiH_3$ | $H_6Si_6F_6$ |
| $\delta d$ (non-doped) $(\Omega \cdot cm)^{-1}$ | $7.9 \times 10^{-10}$ | $4.5 \times 10^{-10}$ | $5.3 \times 10^{-10}$ | $3 \times 10^{-10}$ |
| $\delta d$ (B-doped) $(\Omega \cdot cm)^{-1}$ | $7.1 \times 10^{-8}$ | $2.8 \times 10^{-8}$ | $4.1 \times 10^{-8}$ | $4 \times 10^{-8}$ |
| $\delta d$ (P-doped) $(\Omega \cdot cm)^{-1}$ | $5.3 \times 10^{-6}$ | $4.9 \times 10^{-6}$ | $5.1 \times 10^{-6}$ | $6.0 \times 10^{-6}$ |

TABLE 2B

|  | Example 10 | Reference Example 2 |
|---|---|---|
| Gas for forming active species (A) | $CF_4$ | |
| Activating temperature | 1100° C. | |
| Main active species | $CF_2*$ | |
| Gas for forming active species (B) | $Si_2H_6/H_2$ | |
| Amount from activation chamber (A) | 200 SCCM | |
| Amount from activation chamber (B) | 100 SCCM | |
| Amount from gas bomb | | $CF_4$ 200 SCCM $SiH_4$ 100 SCCM $H_2$ 100 SCCM |
| Pressure in film forming chamber | 1.0 Torr | 1.0 Torr |
| Film forming speed | 15Å/sec | 5Å/sec |
| RF discharge power | | 1.8 W/cm² |
| Photosensitive layer 13 thickness | 22μ | 22μ |
| Average number of image defects in 10 pcs. of drum-shaped electrophotographic imaging member | 3 | 14 |
| Acceptance potential fluctuation in circumferential direction | ±6 V | ±30 V |
| Acceptance potential fluctuation in axial direction | ±15 V | ±35 V |
| Note | Example of this invention | Example of usual plasma CVD Substrate temperature: 260° C. |

TABLE 3B

|  | Example 11 | Example 12 | Example 13 | Example 14 |
|---|---|---|---|---|
| Gas for film formation | $Si_3H_6$ | $Si_4H_{10}$ | $SiH_3SiH—(SiH_3)SiH_3$ | $H_6Si_6F_6$ |
| Rectifying ratio of diode (*1) | $5 \times 10^2$ | $5 \times 10^2$ | $3 \times 10^2$ | $4.5 \times 10^2$ |
| n value of diode (*2) | 1.2 | 1.2 | 1.3 | 1.35 |

*1 ratio of forward current to inverse current at 1 V

*2 n value (quality factor) in a current equation $J = J_s\left\{\exp\left(\frac{eV}{nRT}\right) - 1\right\}$ in a p — n junction

TABLE 1C

|  | Example 15 | Example 16 | Example 17 | Example 18 |
|---|---|---|---|---|
| Carbon compound | $CH_4$ | $C_2H_6$ | $C_2H_4$ | $C_2H_2$ |
| $\delta d$ (non-doped) $(\Omega \cdot cm)^{-1}$ | $8 \times 10^{-1}$ | $3.8 \times 10^{-1}$ | $4.8 \times 10^{-1}$ | $4.5 \times 10^{-1}$ |

TABLE 1D

|  | Example 24 | Example 25 | Example 26 | Example 27 |
|---|---|---|---|---|
| Gas for forming active species (B) | $GeH_4$ | straight chain $Ge_4H_{10}$ | branched $Ge_4H_{10}$ | $H_6Ge_6F_6$ |
| $\delta d$ (non-doped) $(\Omega \cdot cm)^{-1}$ | $7.5 \times 10^{-8}$ | $7.4 \times 10^{-8}$ | $8.0 \times 10^{-8}$ | $6.5 \times 10^{-8}$ |
| $\delta d$ (B-doped) $(\Omega \cdot cm)^{-1}$ | $8.6 \times 10^{-7}$ | $3.1 \times 10^{-7}$ | $4.0 \times 10^{-7}$ | $6.4 \times 10^{-7}$ |
| $\delta d$ (P-doped) $(\Omega \cdot cm)^{-1}$ | $3.5 \times 10^{-6}$ | $7.2 \times 10^{-6}$ | $5.5 \times 10^{-6}$ | $4.8 \times 10^{-6}$ |

TABLE 2C

|  | Example 19 | Reference Example 3 |
|---|---|---|
| Gas for forming active species (A) | $CF_4$ |  |
| Activating temperature | 1100° C. |  |
| Main active species | $CF_2^*$ |  |
| Gas for forming active species (B) | $CH_4/Si_2H_6/H_2$ (vol. ratio 0.1:2:0.1) |  |
| Amount from activation chamber (A) | 200 SCCM |  |
| Amount from activation chamber (B) | 100 SCCM |  |
| Amount from gas bomb |  | $SiF_4$ 200 SCCM<br>$CH_4$ 50 SCCM<br>$SiH_4$ 100 SCCM<br>$H_2$ 100 SCCM |
| Pressure in film forming chamber | 1.0 Torr | 1.0 Torr |
| Film forming speed | 10Å/sec | 5Å/sec |
| RF discharge power |  | 1.8 W/cm² |
| Photosensitive layer 13 thickness | 22μ | 22μ |
| Average number of image defects in 10 pcs. of drum-shaped electrophotographic imaging member | 3 | 15 |
| Acceptance potential fluctuation in circumferential direction | ±8 V | ±28 V |
| Acceptance potential fluctuation in axial direction | ±15 V | ±35 V |
| Note | Example of this invention | Example of usual plasma CVD Substrate temperature: 250° C. |

TABLE 3C

|  | Example 20 | Example 21 | Example 22 | Example 23 |
|---|---|---|---|---|
| Gas for film formation | $CH_4$ | $C_2H_6$ | $C_2H_4$ | $C_2H_5$ |
| Rectifying ratio of diode (*1) | $7 \times 10^2$ | $7 \times 10^2$ | $6.5 \times 10^2$ | $7.5 \times 10^2$ |
| n value of diode (*2) | 1.1 | 1.1 | 1.2 | 1.25 |

*1 ratio of forward current to inverse current at 1 V

*2 n value (quality factor) in a current equation $J = J_s\left\{\exp\left(\frac{eV}{nRT}\right) - 1\right\}$ for a p — n junction

TABLE 2D

|  | Example 28 | Reference Example 4 |
|---|---|---|
| Gas for forming active species (A) | $CF_4$ |  |
| Activating temperature | 1100° C. |  |
| Main active species | $CF_2^*$ |  |
| Gas for forming active species (B) | $Si_2H_6/H_2$ |  |
| Amount from activating chamber (A) | 200 SCCM |  |
| Amount from activating chamber (B) | 100 SCCM |  |
| Amount from gas bomb |  | $CF_4$ 200 SCCM<br>$Si_2H_6$ 100 SCCM<br>$GeH_4$ 50 SCCM |

TABLE 2D-continued

|  | Example 28 | Reference Example 4 |
|---|---|---|
|  |  | $H_2$ 100 SCCM |
| Pressure in film forming chamber | 1.0 Torr | 1.0 Torr |
| Film forming speed | 10Å/sec | 3Å/sec |
| RF discharge power |  | 1.8 W/cm² |
| Photosensitive layer 13 thickness | 22μ | 22μ |
| Average number of image defects in 10 pcs. of drum-shaped electrophotographic imaging member | 3 | 21 |
| Acceptance potential fluctuation in circumferential direction | ±11 V | ±30 V |
| Acceptance potential fluctuation in axial direction | ±17 V | ±40 V |
| Note | Example of this invention | Example of usual plasma CVD substrate temperature: 250° C. |

TABLE 3D

|  | Example 29 | Example 30 | Example 31 | Example 32 |
|---|---|---|---|---|
| Gas for forming species (B) | $GeH_4$ | linear $Ge_4H_{10}$ | branched $Ge_4H_{10}$ | $H_6Ge_6F_6$ |
| Rectifying ratio of diode (*1) | $8 \times 10^2$ | $7.5 \times 10^2$ | $6.3 \times 10^2$ | $5.8 \times 10^2$ |
| n value of diode (*2) | 1.2 | 1.3 | 1.42 | 1.38 |

*1 ratio of forward current to inverse current at 1 V
*2 n value (quality factor) in a current equation $$J = J_s \left\{ \exp\left(\frac{eV}{nRT}\right) - 1 \right\} \text{ for a p } - \text{ n junction}$$

TABLE 1E

|  | Example 33 | Example 34 |
|---|---|---|
| Gas for forming active species (B) | $H_3SiOSiH_3$ | $H_3SiOSiH_3/H_2/F_2$ |
| δd $(\Omega \cdot cm)^{-1}$ | $7.2 \times 10^{-8}$ | $8.0 \times 10^{-8}$ |

TABLE 2E

|  | Example 35 | Reference Example 5 |
|---|---|---|
| Gas for forming active species (A) | $CF_4/SiF_4$ |  |
| Activating temperature | 1000° C. |  |
| Main active species | $CF_2^*$ $SiF_2^*$ |  |
| Gas for forming active species (B) | disiloxane $H_2$ |  |
| Amount from activation chamber (A) | 200 SCCM |  |
| Amount from activation chamber (B) | 100 SCCM |  |
| Amount from gas bomb |  | $CF_4$ 50 SCCM $SiF_4$ 100 SCCM $SiH_4$ 100 SCCM disiloxane 50 SCCM $H_2$ 100 SCCM |
| Pressure in film forming chamber | 0.3 Torr | 1.0 Torr |
| Film forming speed | 10Å/sec | 5Å/sec |
| RF discharge power |  | 1.8 W/cm² |
| Photosensitive layer 13 thickness | 22μ | 22μ |
| Average number of image defects in 10 pcs. of drum-shaped electrophotographic imaging member | 5 | 20 |
| Acceptance potential fluctuation in circumferential direction | ±12 V | ±28 V |
| Acceptance potential fluctuation in axial direction | ±15 V | ±33 V |
| Note | Example of this invention | Example of usual plasma CVD substrate temperature: 250° C. |

TABLE 3E

|  | Example 36 | Example 37 |
|---|---|---|
| Gas for film formation | $H_3SiOSiH_3/H_2$ | $H_3SiOSiH_3/H_2/F_2$ |
| Rectifying ratio of diode (*1) | $2 \times 10^2$ | $2.5 \times 10^2$ |
| n value of diode (*2) | 1.1 | 1.0 |

*1 ratio of forward current to inverse current at 1 V
*2 n value (quality factor) for a current equation $$J = J_s \left\{ \exp\left(\frac{eV}{nRT}\right) - 1 \right\} \text{ for a p } - \text{ n junction}$$

TABLE 1F

|  | Example 38 | Example 39 |
|---|---|---|
| Gas for forming active species (B) | $(C_2H_5)_3SiNH_2$ | $(C_2H_5)_3SiNH_2/H_2/F_2$ |
| δd (non-doped) $(\Omega \cdot cm)^{-1}$ | $1.5 \times 10^{-9}$ | $1.1 \times 10^{-9}$ |

TABLE 2F

|  | Example 40 | Reference Example 6 |
|---|---|---|
| Gas for forming active species (A) | $CF_4/SiF_4$ |  |
| Activating temperature | 1000° C. |  |
| Main active species | $CF_2^*$ $SiF_2^*$ |  |
| Gas for forming active species (B) | Triethyldisilazane $H_2$ |  |
| Amount from activating chamber (A) | 200 SCCM |  |
| Amount from activating chamber (B) | 100 SCCM |  |
| Amount from gas bomb |  | $CF_4$ 50 SCCM $SiF_4$ 100 SCCM $SiH_4$ 100 SCCM Triethyldisilazane 50 SCCM $H_2$ 100 SCCM |
| Pressure in film forming chamber | 0.5 Torr | 1.0 Torr |
| Film forming speed | 12Å/sec | 5Å/sec |
| RF discharge power |  | 18 W/cm² |
| Photosensitive layer | 22μ | 22μ |

TABLE 2F-continued

| | Example 40 | Reference Example 6 |
|---|---|---|
| 13 thickness | | |
| Average number of image defects in 10 pcs. of drum-shaped electrophotographic imaging member | 6 | 18 |
| Potential fluctuation in circumferencial direction | ±10 V | ±30 V |
| Potential fluctuation in axial direction | ±15 V | ±35 V |
| Note | Example of this invention | Example of usual plasma CVD substrate temperature: 250° C. |

TABLE 3F

| | Example 41 | Example 42 |
|---|---|---|
| Gas for film formation | $(C_2H_5)_3SiNH_2/H_2$ | $(C_2H_5)_3SiNH_2/H_2/F_2$ |
| Rectifying ratio of diode (*1) | $2.9 \times 10^2$ | $3.0 \times 10^2$ |
| n value of diode (*2) | 1.1 | 1.0 |

*1 ratio of forward current to inverse current at 1 V
*2 n value (quality factor) in a current equation $$J = J_s \left\{ \exp\left(\frac{eV}{nRT}\right) - 1 \right\} \text{ for a p } - \text{ n junction}$$

What is claimed is:

1. A process for forming a deposited film, which comprises introducing into a film forming space housing a substrate therein an active species (A) formed by decomposition of a compound containing carbon and a halogen and an active species (B) formed by decomposition of a chemical substance for film formation which is reactive with said active species (A) separately from each other, and then allowing both the species to react with each other thereby to form a deposited film on the substrate.

2. A process according to claim 1, wherein said active species (B) is formed from hydrogen and/or a halogen compound.

3. A process according to claim 1, wherein said active species (B) is formed from a silicon containing compound.

4. A process according to claim 1, wherein said active species (B) is formed from a carbon containing compound.

5. A process according to claim 1, wherein said active species (B) is formed from a germanium containing compound.

6. A process according to claim 1, wherein said active species (B) is formed from an oxygen containing compound.

7. A process according to claim 1, wherein said active species (B) is formed from a nitrogen containing compound.

8. A process according to claim 1, wherein said active species (A) is formed by decomposition of a chain or cyclic hydrocarbon of which hydrogen atoms are partially or wholly substituted with halogen atoms.

9. A process according to claim 8, wherein said active species (B) is formed from hydrogen and/or a halogen compound.

10. A process according to claim 8, wherein said active species (B) is formed from a silicon containing compound.

11. A process according to claim 8, wherein said active species (B) is formed from a carbon containing compound.

12. A process according to claim 8, wherein said active species (B) is formed from a germanium containing compound.

13. A process according to claim 8, wherein said active species (B) is formed from an oxygen containing compound.

14. A process according to claim 8, wherein said active species (B) is formed from a nitrogen containing compound.

15. A process according to claim 1, wherein an active species (SX) formed by decomposition of a compound containing silicon and a halogen is used in addition to said active species (A).

16. A process according to claim 15, wherein said active species (B) is formed from hydrogen and/or a halogen compound.

17. A process according to claim 15, wherein said active species (B) is formed from a silicon containing compound.

18. A process according to claim 15, wherein said active species (B) is formed from a carbon containing compound.

19. A process according to claim 15, wherein said active species (B) is formed from a germanium containing compound.

20. A process according to claim 15, wherein said active species (B) is formed from an oxygen containing compound.

21. A process according to claim 15, wherein said active species (B) is formed from a nitrogen containing compound.

* * * * *